(12) United States Patent
Jung et al.

(10) Patent No.: US 12,408,330 B2
(45) Date of Patent: Sep. 2, 2025

(54) SEMICONDUCTOR MEMORY DEVICE

(71) Applicant: SAMSUNG ELECTRONICS CO., LTD., Suwon-si (KR)

(72) Inventors: Hosun Jung, Hwaseong-si (KR); Minwu Kim, Hwaseong-si (KR); Jungwoo Song, Hwaseong-si (KR); Wonchul Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 390 days.

(21) Appl. No.: 17/886,731

(22) Filed: Aug. 12, 2022

(65) Prior Publication Data

US 2023/0232619 A1 Jul. 20, 2023

(30) Foreign Application Priority Data

Jan. 18, 2022 (KR) .................. 10-2022-0007397

(51) Int. Cl.
*H10B 12/00* (2023.01)

(52) U.S. Cl.
CPC ............. *H10B 12/50* (2023.02); *H10B 12/09* (2023.02); *H10B 12/315* (2023.02)

(58) Field of Classification Search
CPC .............................. H10B 12/50; H10B 12/09
See application file for complete search history.

(56) References Cited

U.S. PATENT DOCUMENTS

| | | |
|---|---|---|
| 6,583,458 B1 | 6/2003 | Hayashi et al. |
| 8,791,518 B2 | 7/2014 | Kim |
| 8,809,162 B2 | 8/2014 | Lee et al. |
| 9,721,808 B2 | 8/2017 | Kang et al. |
| 10,163,641 B2 | 12/2018 | Lee et al. |
| 10,249,627 B2 | 4/2019 | Han et al. |
| 10,795,255 B2 | 10/2020 | Hsu et al. |
| 10,877,370 B2 | 12/2020 | Yang et al. |
| 2017/0053802 A1* | 2/2017 | Park .................. H01L 21/32139 |
| 2017/0084710 A1 | 3/2017 | Koh et al. |
| 2018/0122810 A1* | 5/2018 | Han ....................... H10B 12/033 |
| 2018/0342519 A1* | 11/2018 | Kim ....................... H10D 1/716 |

(Continued)

FOREIGN PATENT DOCUMENTS

| | | | |
|---|---|---|---|
| KR | 20190130444 A | * | 11/2019 |
| TW | 425697 B | | 3/2001 |
| TW | 201624674 A | | 7/2016 |

*Primary Examiner* — Edward Chin
(74) *Attorney, Agent, or Firm* — Muir Patent Law, PLLC

(57) ABSTRACT

A semiconductor memory device includes a substrate including memory cell, peripheral, and intermediate regions; a device isolation pattern; a partitioning pattern; bit lines extending in a first direction to a boundary between the intermediate and peripheral regions; storage node contacts on the memory cell region and filling a lower portion of a space between bit lines; landing pads on the storage node contacts; dummy storage node contacts on the intermediate region and filling a lower portion of a space between bit lines; dummy landing pads on the dummy storage node contacts; and a dam structure on the intermediate region, extending in the first direction, and having a bar shape, wherein the dummy landing pads are spaced apart from an edge of the dam structure in a second direction, and the dummy storage node contacts are in contact with the partitioning pattern.

20 Claims, 26 Drawing Sheets

(56) References Cited

U.S. PATENT DOCUMENTS

| | | |
|---|---|---|
| 2020/0402981 A1* | 12/2020 | Kim .................. H10B 12/0335 |
| 2021/0082924 A1* | 3/2021 | Seong ................ H10B 12/315 |
| 2021/0167059 A1 | 6/2021 | Lee et al. |
| 2021/0217867 A1 | 7/2021 | Ahn et al. |

* cited by examiner

SEMICONDUCTOR MEMORY DEVICE

CROSS-REFERENCE TO RELATED APPLICATIONS

This U.S. non-provisional patent application claims priority under 35 U.S.C. § 119 to Korean Patent Application No. 10-2022-0007397, filed on Jan. 18, 2022, in the Korean Intellectual Property Office, the entire contents of which are hereby incorporated by reference.

BACKGROUND

1. Field

Embodiments relate to a semiconductor memory device.

2. Description of the Related Art

Due to their small-sized, multifunctional, and low-cost characteristics, semiconductor devices are being esteemed as important elements in the electronics industry. The semiconductor devices may include a semiconductor memory device for storing data, a semiconductor logic device for processing data, or a hybrid semiconductor device including both of memory and logic elements.

With the recent trend of high speed and low power consumption of electronic devices, semiconductor devices embedded in the electronic devices may also have high operating speeds and/or low operating voltages, and an integration density of the semiconductor device may be increased.

SUMMARY

The embodiments may be realized by providing a semiconductor memory device including a substrate including a memory cell region, a peripheral region enclosing the memory cell region, and an intermediate region between the memory cell region and the peripheral region; a device isolation pattern on the memory cell region and defining an active portion in the memory cell region; a partitioning pattern on the intermediate region; a plurality of bit lines on the memory cell region and the intermediate region and extending in a first direction, the bit lines extending to a boundary portion between the intermediate region and the peripheral region; storage node contacts on the memory cell region and filling a lower portion of a space between some of the bit lines; landing pads on the storage node contacts, respectively; dummy storage node contacts on the intermediate region and filling a lower portion of a space between other ones of the bit lines; dummy landing pads on the dummy storage node contacts, respectively; and at least one dam structure on the intermediate region and extending in the first direction, the at least one dam structure having a bar shape when viewed in a plan view, wherein the dummy landing pads are spaced apart from an edge portion of the at least one dam structure in a second direction perpendicular to the first direction, and the dummy storage node contacts are in contact with the partitioning pattern.

The embodiments may be realized by providing a semiconductor memory device including a substrate including a memory cell region, a peripheral region enclosing the memory cell region, and an intermediate region between the memory cell region and the peripheral region; a device isolation pattern on the substrate and defining an active portion in the memory cell region; a plurality of bit lines on the memory cell region and the intermediate region and extending in a first direction, the bit lines extending to a boundary portion between the intermediate region and the peripheral region; storage node contacts on the memory cell region and filling a lower portion of a space between some of the bit lines; landing pads on the storage node contacts, respectively; dummy storage node contacts on the intermediate region and filling a lower portion of a space between other ones of the bit lines; dummy landing pads on the dummy storage node contacts; a dam structure on the intermediate region and spaced apart from the dummy landing pads in a second direction perpendicular to the first direction; and first metal line patterns on the peripheral region, connected to the bit lines, and extending in the first direction, wherein the dummy landing pads are closer to the first metal line patterns than to the dam structure, when viewed in a plan view.

The embodiments may be realized by providing a semiconductor memory device including a substrate including a memory cell region, a peripheral region enclosing the memory cell region, and an intermediate region between the memory cell region and the peripheral region; device isolation patterns on the substrate and defining an active portion in the memory cell region; a partitioning pattern on the intermediate region; a plurality of bit lines on the memory cell region and the intermediate region and extending in a first direction, the plurality of bit lines extending to a boundary portion between the intermediate region and the peripheral region; dummy storage node contacts on the intermediate region and filling a lower portion of a space between the bit lines; dummy landing pads on the dummy storage node contacts, respectively; and a pair of dam structures on the intermediate region and extending in the first direction, wherein each of the pair of dam structures has a bar shape, when viewed in a plan view, the dummy landing pads are spaced apart from an edge portion of the pair of dam structures in a second direction perpendicular to the first direction, the pair of dam structures are spaced apart from each other with the dummy landing pads, the landing pads, and the bit lines therebetween, when viewed in a plan view, and the dummy landing pads and pair of dam structures are vertically overlapped with the partitioning pattern.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
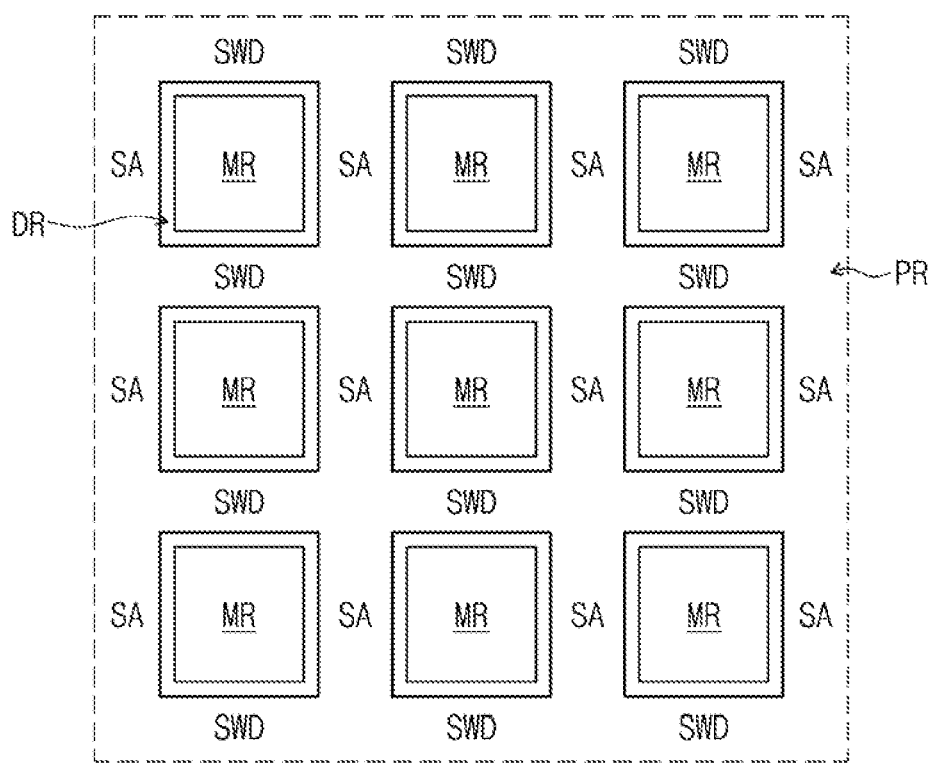
FIG. 1 is a block diagram of a semiconductor memory device according to an embodiment.
Figure 1:
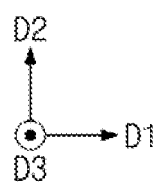

FIG. 1 is a block diagram of a semiconductor memory device according to an embodiment. In an implementation, the semiconductor memory device may be a DRAM device. Referring to FIG. 1, the semiconductor memory device may include a memory cell region MR, an intermediate region DR, and a peripheral region PR. The peripheral region PR may enclose the memory cell region MR, and the intermediate region DR may be therebetween.

Memory cell circuits (e.g., memory integrated circuits) may be in or on the memory cell region MR. Peripheral circuits (e.g., peripheral transistors) may be in or on the peripheral region PR. In an implementation, the peripheral circuits may include sense-amplifier circuits SA or sub-word line driver circuits SWD. The peripheral circuits may further include power or ground circuits, which may be used to drive a sense amplifier.

Figure 2:
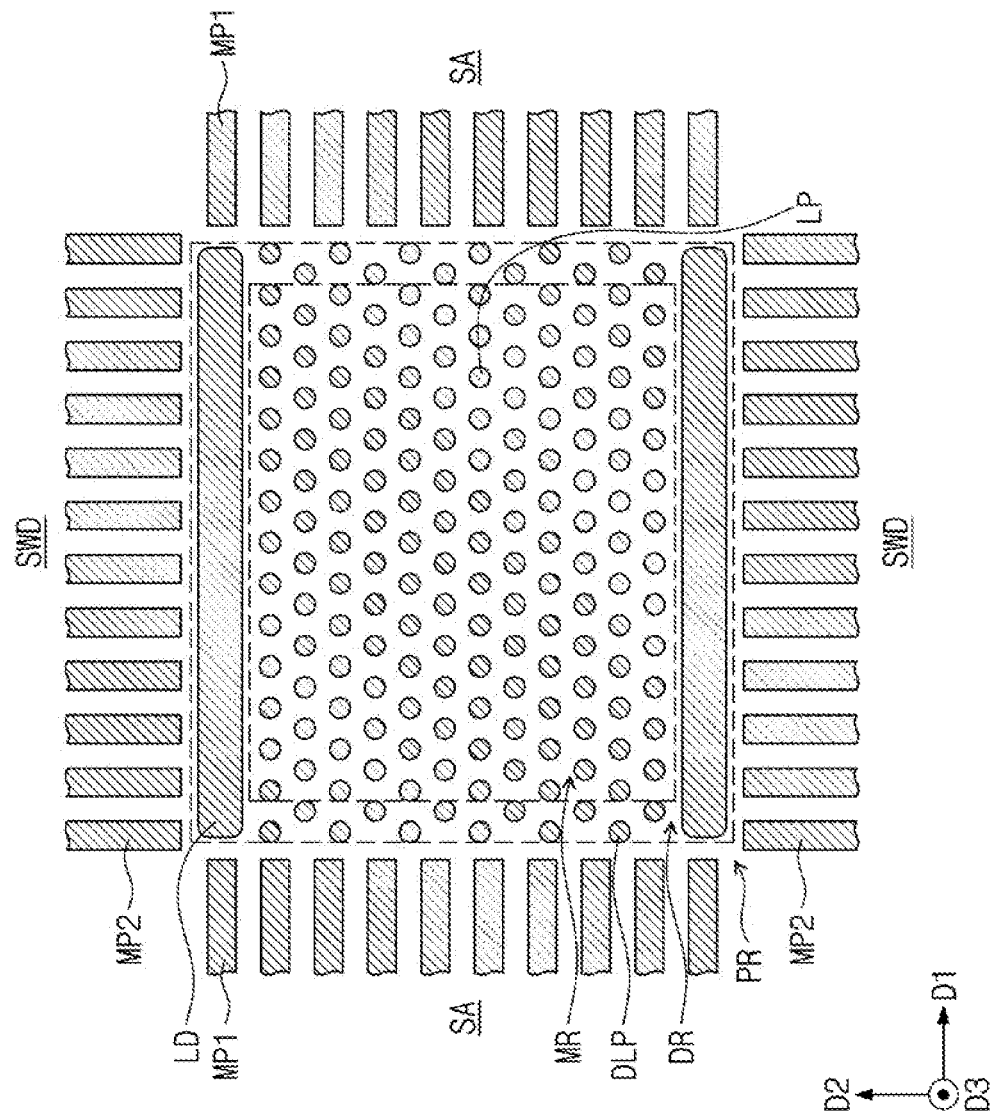
FIG. 2 is a plan view of a semiconductor memory device according to an embodiment.

FIG. 2 is a plan view of a semiconductor memory device according to an embodiment.

Referring to FIG. 2, landing pads LP, which may be electrically connected to the memory cell circuits, may be on the memory cell region MR. Each of the landing pads LP may have a circular or round top surface. The memory cell region MR may have a tetragonal or rectangular shape that is parallel to first and second directions D1 and D2 (e.g., in a D1-D2 plane), when viewed in a plan view. The landing pads LP may be arranged in the first or second direction D1 or D2 to form a zigzag or honeycomb shape.

At least one dam structure LD and dummy landing pads DLP may be on the intermediate region DR.

The dam structure LD may be configured to help reduce a process difficulty, which could otherwise be caused by a difference in pattern density between the memory cell region MR and the peripheral region PR, and to help improve the structural stability of the semiconductor memory device. The dam structure LD may be a line-shaped or bar-shaped pattern extending (e.g., lengthwise) in the first direction D1. In an implementation, a pair of dam structures LD may be spaced apart from each other in the second direction D2 with the landing pads LP therebetween. When viewed in a plan view, the dam structure LD may extend (e.g., lengthwise) along the memory cell region MR in the first direction D1, and not in the second direction D2 (e.g., the dam structure LD may only have a narrower widthwise dimension in the second direction D2). The dam structure LD may be around (e.g., at an outer edge of) the memory cell region MR and may extend (e.g., in parallel) along two opposite sides of the memory cell region MR.

The dummy landing pads DLP may be arranged (e.g., spaced apart) in the second direction D2 from an edge portion of the dam structure LD. A diameter of each of the dummy landing pads DLP may be substantially equal to a diameter of each of the landing pads LP.

First metal line patterns MP1 and second metal line patterns MP2 may be on the peripheral region PR. The first metal line patterns MP1 may extend (e.g., lengthwise) in the first direction D1. The first metal line patterns MP1 may be connected to bit lines on the memory cell region MR and the sense-amplifier circuits SA on the peripheral region PR. The second metal line patterns MP2 may extend (e.g., lengthwise) in the second direction D2. The second metal line patterns MP2 may be connected to word lines on the memory cell region MR and the sub-word line driver circuits SWD.

Each of the landing pads LP, the dam structure LD, the dummy landing pads DLP, the first metal line pattern MP1, and the second metal line pattern MP2 may have top surfaces that are at substantially a same level (e.g., distance from a substrate 10) in a third direction D3. In an implementation, the landing pads LP, the dam structure LD, the dummy landing pads DLP, the first metal line pattern MP1, and the second metal line pattern MP2 may each be formed of or include a same metallic material. In an implementation, they may be formed of or include, e.g., tungsten (W).

The dummy landing pads DLP may be selectively or locally included between the landing pads LP and the first metal line patterns MP1. A line-shaped dam structure having an elongated shape, e.g., the dam structure LD, may not be included or extend between the landing pads LP and the first metal line patterns MP1 (e.g., in the first direction D1).

The dam structure LD may be selectively or locally included between the landing pads LP and the second metal line patterns MP2. The dummy landing pads DLP may not be included between the dam structure LD and the second metal line patterns MP2 (e.g., in the second direction).

When viewed in a plan view, the landing pads LP and the dummy landing pads DLP may be spaced apart from each other in the first and second directions D1 and D2. In an implementation, the landing pads LP may be arranged in the first or second direction D1 or D2 to form a zigzag shape. In an implementation, a pair of the landing pads LP, which are most adjacent (e.g., closest or proximate) to each other in the first direction D1, may be shifted or offset from each other in the second direction D2. The dummy landing pads DLP may be arranged in the second direction D2 to form a zigzag shape.

Figure 3:
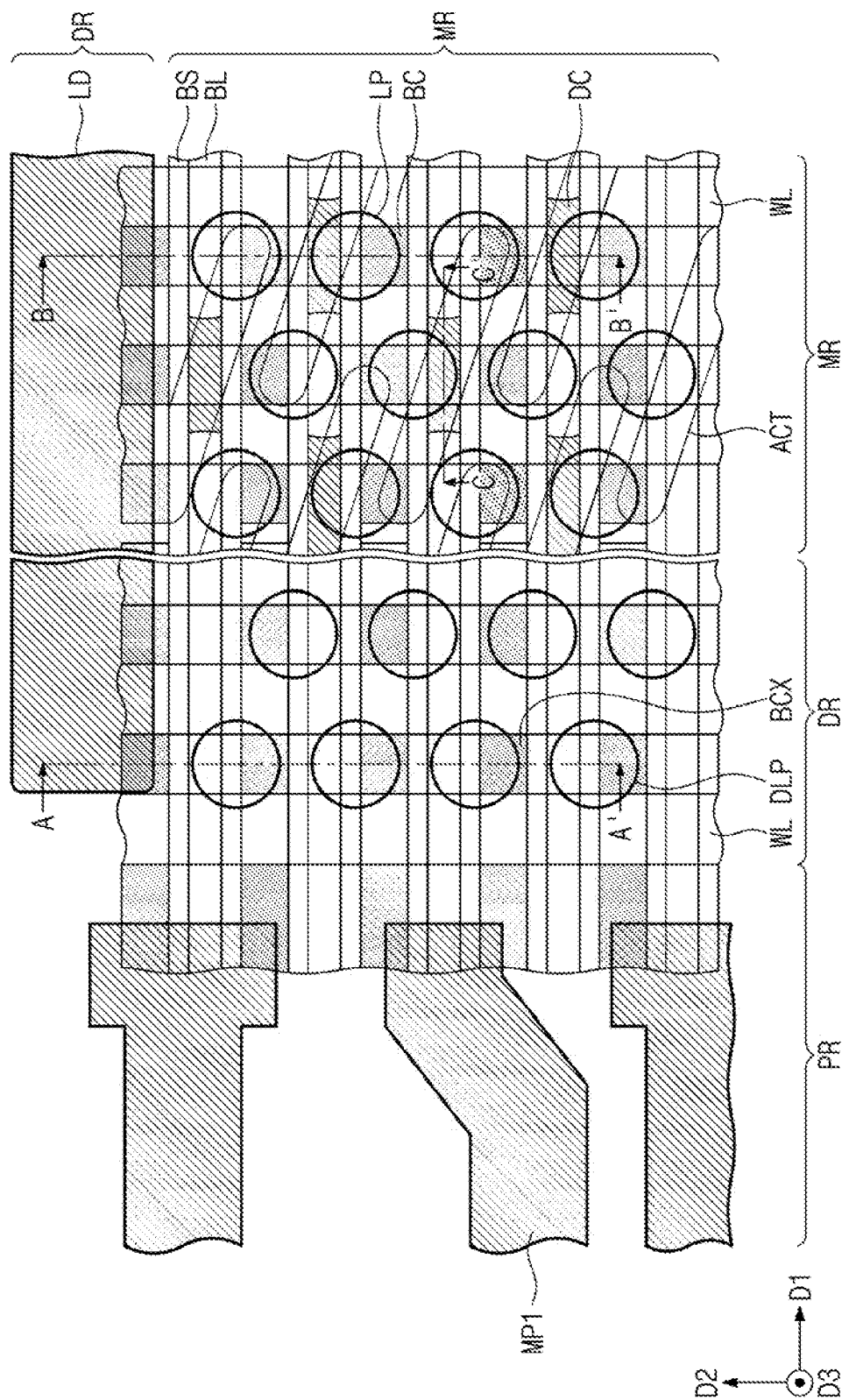
FIG. 3 is an enlarged plan view of a portion of the semiconductor memory device of FIG. 2.
Figure 4A:
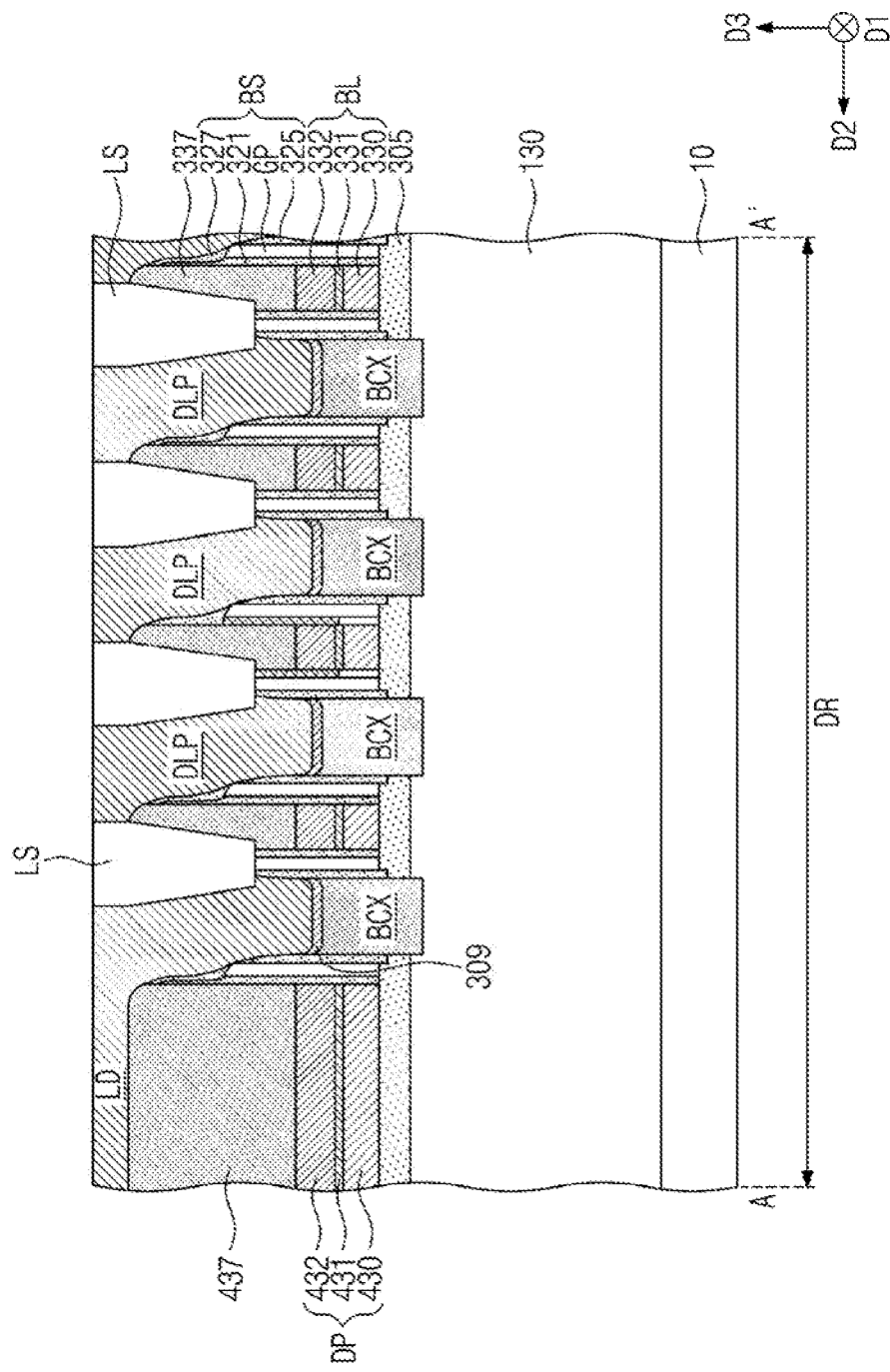
FIG. 4A is a sectional view taken along a line A-A' of FIG. 3.
Figure 4B:
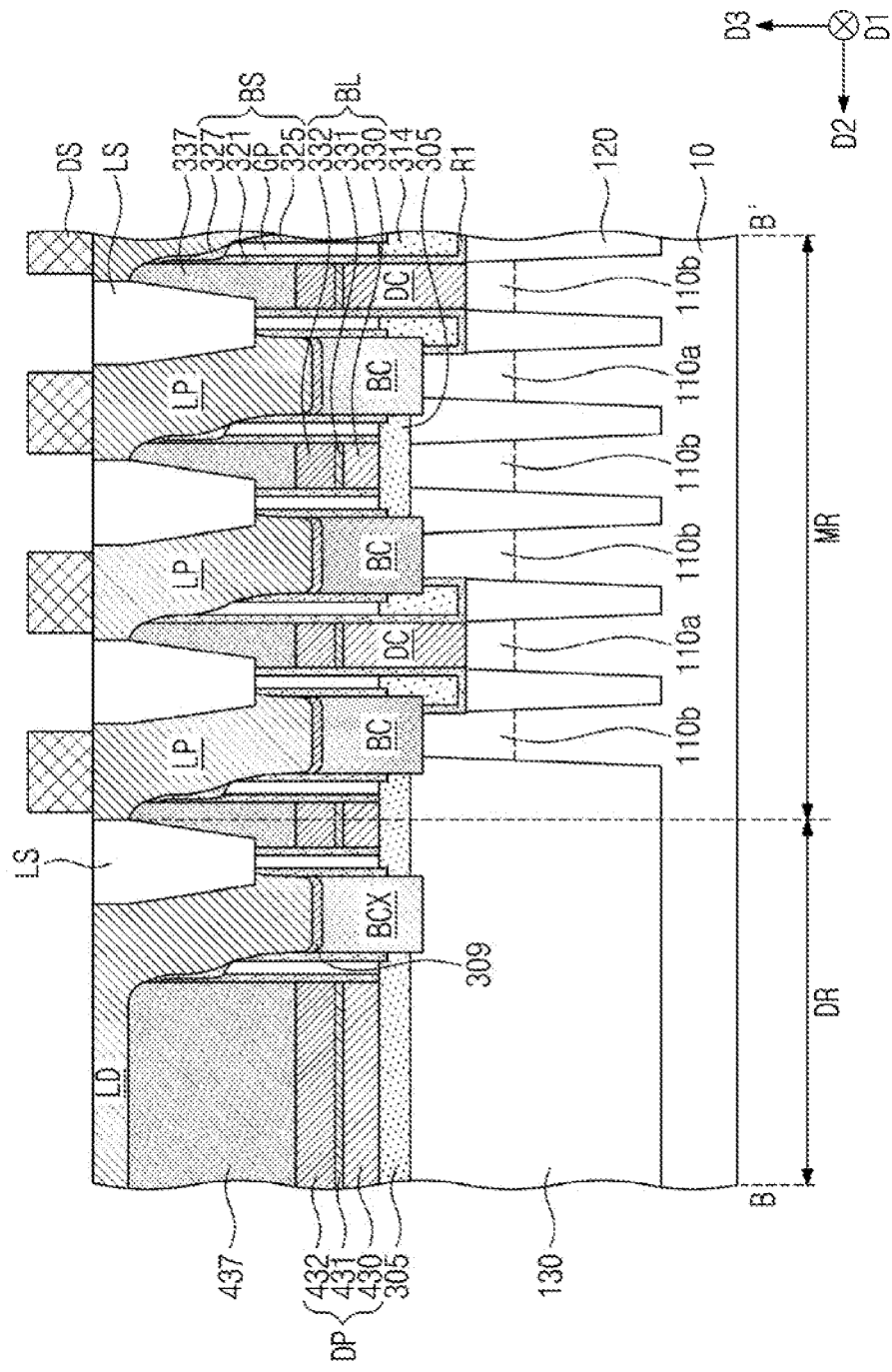
FIG. 4B is a sectional view taken along a line B-B' of FIG. 3.
Figure 4C:
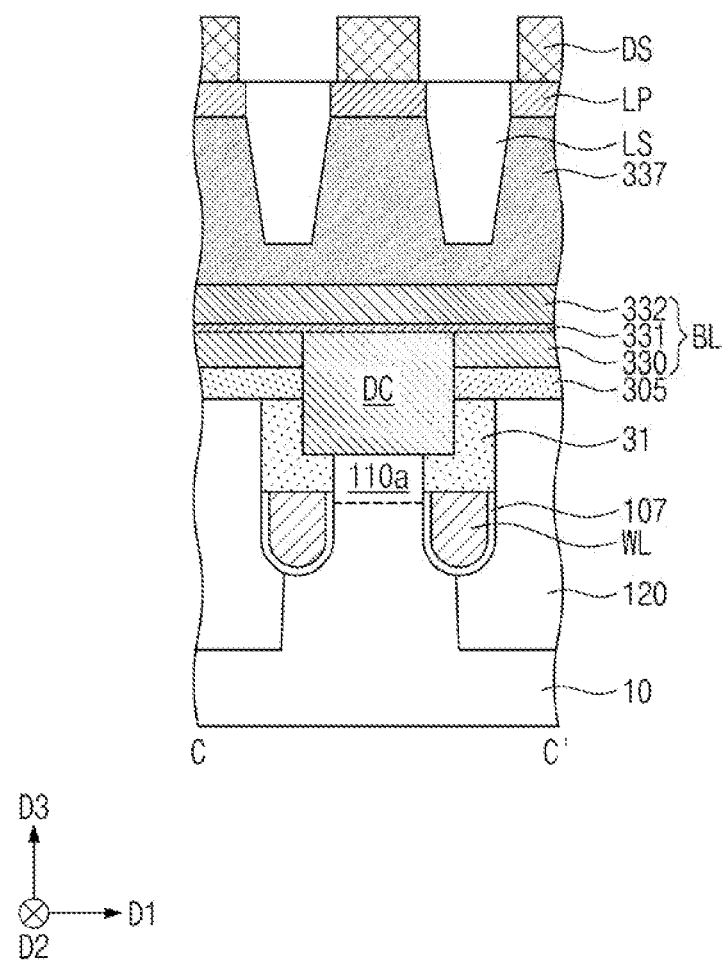
FIG. 4C is a sectional view taken along a line C-C' of FIG. 3.

FIG. 3 is an enlarged plan view of a portion of the semiconductor memory device of FIG. 2. FIG. 4A is a sectional view taken along a line A-A' of FIG. 3. FIG. 4B is a sectional view taken along a line B-B' of FIG. 3. FIG. 4C is a sectional view taken along a line C-C' of FIG. 3.

Referring to FIGS. 3, 4A, 4B, and 4C, the substrate 10 may include the memory cell region MR, the intermediate region DR, and the peripheral region PR. The substrate 10 may be a semiconductor substrate (e.g., a silicon substrate, a germanium substrate, or a silicon-germanium substrate). As used herein, the term "or" is not an exclusive term, e.g., "A or B" would include A, B, or A and B.

As shown in FIGS. 3 and 4B, active portions ACT may be on the memory cell region MR of the substrate 10. The active portions ACT may be spaced apart from each other in the first and second directions D1 and D2. The first and second directions D1 and D2 may be parallel to a top surface of the substrate 10 and may be non-parallel (e.g., orthogonal) to each other. The active portions ACT may be bar-shaped patterns, which extend (e.g., lengthwise) in a direction that is parallel to the top surface of the substrate 10 and may be inclined relative to the first and second directions D1 and D2. An end portion of one of the active portions ACT may be near a center of another active portion ACT adjacent thereto in the second direction D2. Each of the active portions ACT may be a vertically-protruding portion of the substrate 10 which extends (e.g., protrudes) in the third direction D3 that is perpendicular to the top surface of the substrate 10.

Device isolation patterns 120 may be on the memory cell region MR of the substrate 10, and a partitioning pattern 130 may be on the intermediate region DR of the substrate 10. The partitioning pattern 130 may have an area that is larger than an area of each of the device isolation patterns 120, when viewed in a plan view.

The device isolation patterns 120 on the memory cell region MR may be in the substrate 10 to define the active portions ACT. The device isolation patterns 120 and the partitioning pattern 130 may be formed of or include, e.g., silicon oxide, silicon nitride, or silicon oxynitride.

Word lines WL may be on the memory cell region MR to cross the active portions ACT and the device isolation patterns 120. The word lines WL may be in grooves, which may be in the active portions ACT and the device isolation patterns 120. The word lines WL may extend (e.g., lengthwise) in the second direction D2 and may be spaced apart from each other in the first direction D1. The word lines WL may be buried in the substrate 10. At least one of the word lines WL may include a portion that is on the intermediate region DR to cross the partitioning pattern 130.

Impurity regions may be in the active portions ACT. The impurity regions may include first impurity regions 110a and second impurity regions 110b. The second impurity regions 110b may be in or at opposite edge regions of each of the active portions ACT, and each of the first impurity regions 110a may be between the second impurity regions 110b in each of the active portions ACT. The first and second impurity regions 110a and 110b may contain impurities of the same conductivity type (e.g., n-type).

A buffer pattern 305 may be on the memory cell region MR and the intermediate region DR of the substrate 10. The buffer pattern 305 may cover the active portions ACT, the device isolation patterns 120, the partitioning pattern 130, and the word lines WL. The buffer pattern 305 may be formed of or include, e.g., silicon oxide, silicon nitride, or silicon oxynitride.

Bit lines BL may be on the memory cell region MR. The bit lines BL may extend (e.g., lengthwise) from the memory cell region MR to a boundary portion between the peripheral region PR and the intermediate region DR in the first direction D1. The bit lines BL may be spaced apart from each other in the second direction D2. Each of the bit lines BL may include a bit line polysilicon pattern 330, a first ohmic pattern 331, and a metal-containing pattern 332, which are sequentially stacked on the substrate 10. In an implementation, the bit line polysilicon pattern 330 may be formed of or include, e.g., doped or undoped polysilicon. The first ohmic pattern 331 may be formed of or include, e.g., a metal silicide material. The metal-containing pattern 332 may be formed of or include a metallic material (e.g., tungsten, titanium, or tantalum).

The bit line BL may not be on a portion of the intermediate region DR, which vertically overlaps with the dam structure LD. Dummy patterns DP may be on the portion of the intermediate region DR. The dummy patterns DP may include a dummy polysilicon pattern 430, a first dummy ohmic pattern 431, and a dummy metal-containing pattern 432, which are sequentially stacked on the substrate 10. The dummy polysilicon pattern 430, the first dummy ohmic pattern 431, and the dummy metal-containing pattern 432 may be formed of or include substantially the same materials as the bit line polysilicon pattern 330, the first ohmic pattern 331, and the metal-containing pattern 332, respectively.

As shown in FIG. 4B, bit line contacts DC may be on the memory cell region MR and respectively between the bit lines BL and the first impurity regions 110a. The bit line contacts DC may not be on the intermediate region DR. The bit lines BL may be electrically connected to the first impurity regions 110a through the bit line contacts DC. The bit line contacts DC may be formed of or include, e.g., doped or undoped polysilicon. The first impurity region 110a and the device isolation pattern 120 adjacent thereto may form a recess R1, and each of the bit line contacts DC may be in the recess R1. A lower gapfill insulating pattern 314 may fill a remaining portion of the recess R1.

A bit line capping pattern 337 may be on each of the bit lines BL. The bit line capping patterns 337 may be formed of or include, e.g., an insulating material. In an implementation, the bit line capping patterns 337 may be formed of or include a nitride (e.g., silicon nitride) or an oxynitride (e.g., silicon oxynitride). A dummy capping pattern 437 may be on each of the dummy patterns DP. The dummy capping pattern 437 may be formed of or include substantially the same material as the bit line capping pattern 337.

An upper side surface of each of the bit line contacts DC, a side surface of each of the bit lines BL, and a side surface of the bit line capping pattern 337 may be covered with a spacer BS. The spacer BS may extend (e.g., lengthwise) in the first direction D1. The spacer BS may include a first sub-spacer 321 and a second sub-spacer 325, which are spaced apart from each other. In an implementation, the first sub-spacer 321 and the second sub-spacer 325 may be spaced apart from each other by an air gap GP therebetween. The first sub-spacer 321 may be in contact (e.g., direct contact) with the side surface of each of the bit lines BL and may extend to the side surface of the bit line capping pattern 337. The second sub-spacer 325 may be along a side surface of the first sub-spacer 321. The first and second sub-spacers 321 and 325 may be formed of or include, e.g., silicon nitride, silicon oxide, or silicon oxynitride, and may have a single-layered structure or a multi-layered structure. The first and second sub-spacers 321 and 325 may be formed of or include the same material. In an implementation, side surfaces of the dummy patterns DP and side surfaces of the dummy capping pattern 437 may also be covered with the spacer BS.

Storage node contacts BC and dummy storage node contacts BCX may be between adjacent ones of the bit lines BL. The spacer BS may be between the storage node contacts BC (or the dummy storage node contacts BCX) and the bit lines BL adjacent thereto. The storage node contacts BC and the dummy storage node contacts BCX may be spaced apart from each other in the first and second directions D1 and D2.

On the memory cell region MR, each of the storage node contacts BC may be electrically connected to a corresponding one of the second impurity regions 110b. In an implementation, each of the storage node contacts BC may be in contact with the corresponding one of the second impurity regions 110b.

On the intermediate region DR, each of the dummy storage node contacts BCX may be in contact with the partitioning pattern 130. Each of the dummy storage node contacts BCX may be spaced apart from the substrate 10 with the partitioning pattern 130 therebetween.

The storage node contacts BC and the dummy storage node contacts BCX may be formed of or include, e.g., doped or undoped polysilicon. Second ohmic patterns 309 may be respectively on the storage node contacts BC and the dummy storage node contacts BCX. The second ohmic patterns 309 may be formed of or include, e.g., a metal silicide material.

The landing pads LP may be on the storage node contacts BC, respectively. The dummy landing pads DLP may be on the storage node contacts BCX, respectively. In an implementation, a diffusion-prevention pattern may be on a bottom surface of each of the landing pads LP and the dummy landing pads DLP.

Insulating patterns LS may fill spaces between the landing pads LP and between the dummy landing pads DLP. In an implementation, the insulating pattern LS may define the landing pads LP and the dummy landing pads DLP. The insulating pattern LS may be a node separation element of separating adjacent ones of the landing pads LP and adjacent ones of the dummy landing pads DLP from each other. In an implementation, the insulating pattern LS may be an edge portion of the memory cell region MR to fill spaces between the landing pads LP and the dam structure LD and between the dummy landing pad DLP and the dam structure LD.

A data storage pattern DS may be on the landing pad LP. The data storage pattern DS may be or include a bottom electrode of a capacitor, a phase-change pattern, a variable resistance pattern, or a magnetic tunnel junction pattern.

FIGS. 5A, 6A, 7A, 8A, 9A, 10A, and 11A are sectional views, which are taken along the line A-A' of FIG. 3, of stages in a method of fabricating a semiconductor memory device according to an embodiment. FIGS. 5B, 6B, 7B, 8B, 9B, 10B, and 11B are sectional views, which are taken along the line B-B' of FIG. 3 of stages in the method of fabricating a semiconductor memory device according to an embodiment.

Figure 5A:
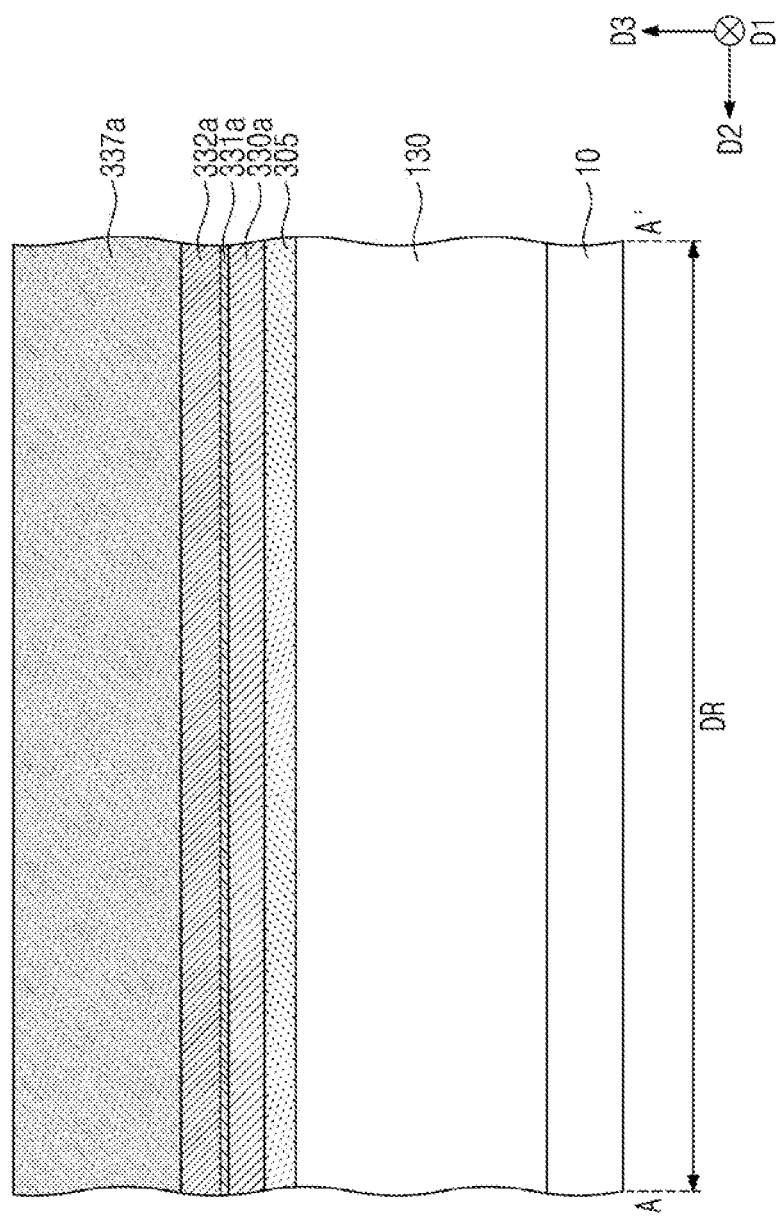
FIGS. 5A, 6A, 7A, 8A, 9A, 10A, and 11A are sectional views, which are taken along the line A-A' of FIG. 3, of stages in a method of fabricating a semiconductor memory device according to an embodiment.
Figure 5B:
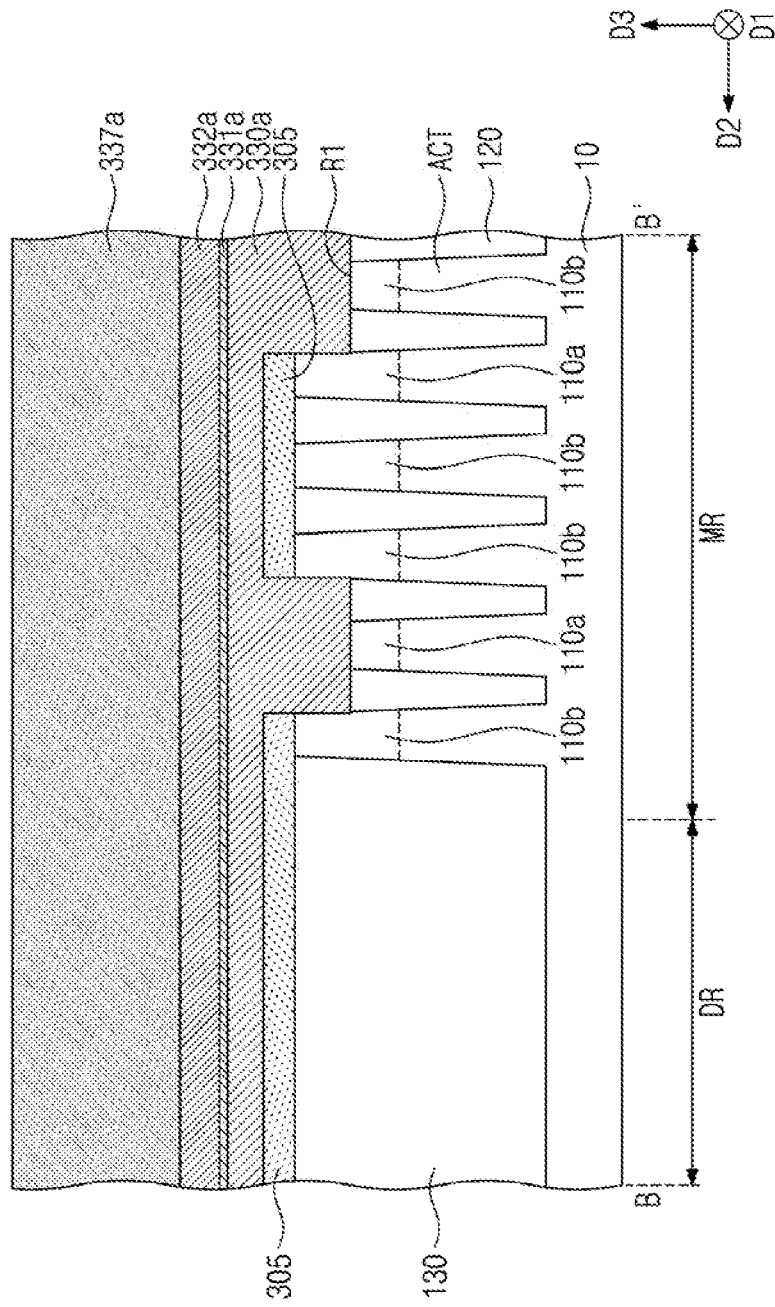
FIGS. 5B, 6B, 7B, 8B, 9B, 10B, and 11B are sectional views, which are taken along the line B-B' of FIG. 3, of stages in the method of fabricating a semiconductor memory device according to an embodiment.

Referring to FIGS. 5A and 5B, the device isolation patterns 120 may be formed in the substrate 10 to define the active portions ACT. The partitioning pattern 130 and the device isolation patterns 120 may be formed at the same time (e.g., using the same process). In an implementation, first trenches and a second trench may be formed in the substrate 10. The device isolation patterns 120 may be formed to fill the first trenches, respectively. The partitioning pattern 130 may be formed to fill the second trench. The substrate 10 and the device isolation patterns 120 may be etched to form grooves, and then, a gate dielectric layer 107, the word lines WL, and the word line capping pattern 31 may be formed in the grooves (e.g., see FIG. 4C). The first impurity region 110a and the second impurity region 110b may be formed by injecting dopants into the active portions ACT using the word line capping patterns 31, the device isolation pattern 120, and the partitioning pattern 130 as an implantation mask (e.g., see FIG. 4C).

Thereafter, the buffer pattern 305 may be formed on the substrate 10. The buffer pattern 305 may be formed by forming a buffer layer on the substrate 10 and patterning the buffer layer. The recess R1 may be formed by etching the device isolation pattern 120, the substrate 10, and the word line capping patterns 31 using the buffer pattern 305 as an etch mask. The recess R1 may be formed to expose the first impurity regions 110a. A polysilicon layer 330a, a first ohmic layer 331a, a metal-containing layer 332a, and a capping layer 337a may be formed on the substrate 10. The first ohmic layer 331a may be formed of or include a metal silicide material (e.g., cobalt silicide).

Figure 6A:
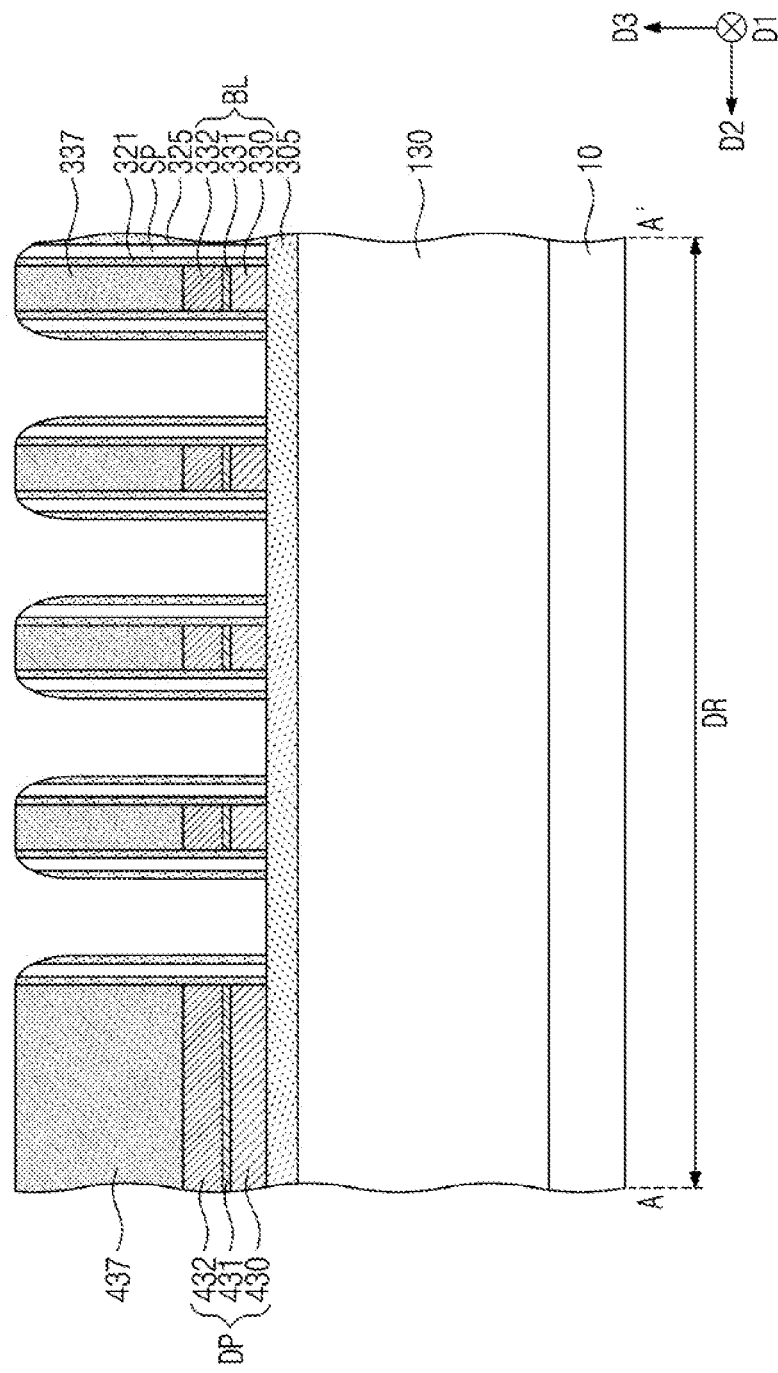
Figure 6B:
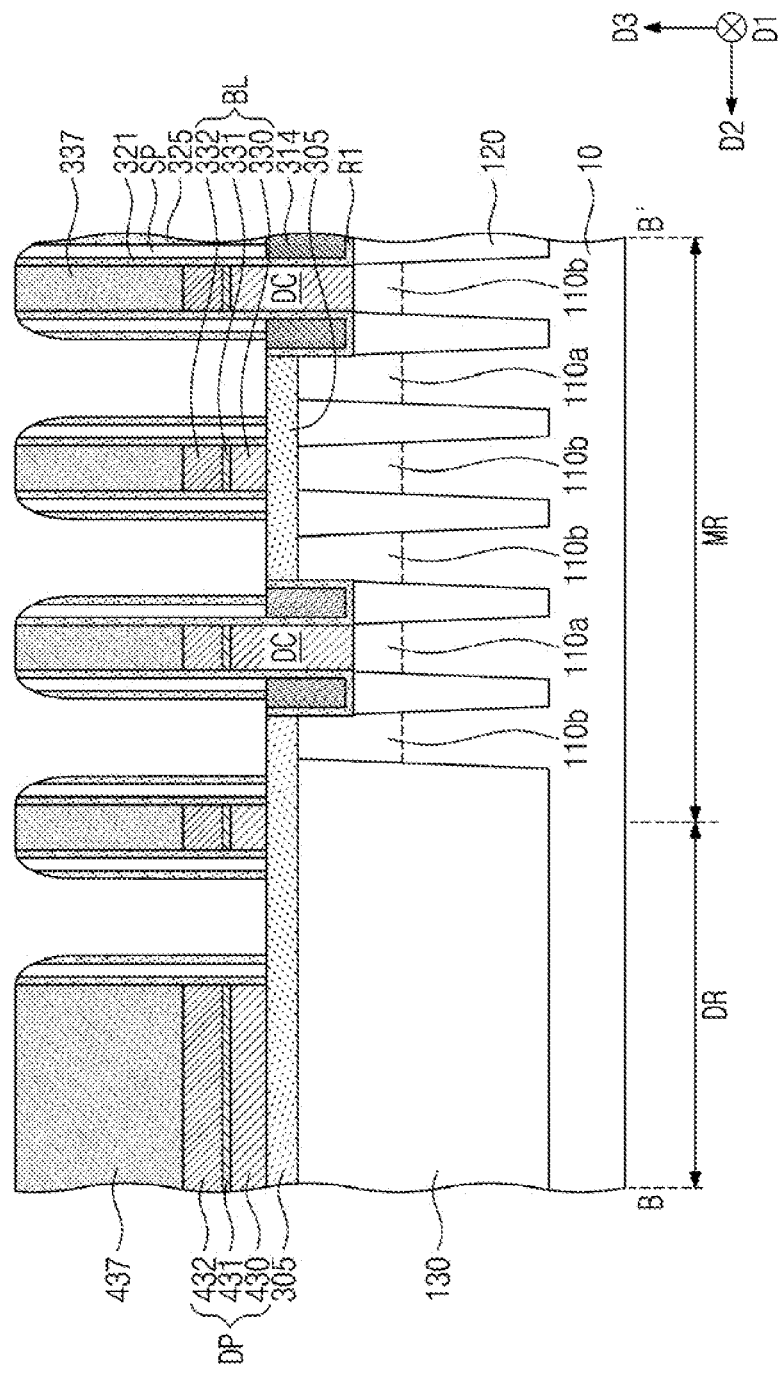

Referring to FIGS. 6A and 6B, a mask pattern, which is used to define a planar shape of the bit line BL, may be formed on the capping layer 337a of FIGS. 5A and 5B. The bit line BL, the bit line contact DC, the bit line capping pattern 337, the dummy pattern DP, and the dummy capping pattern 437 may be formed by performing an etching process using the mask pattern as an etch mask.

The etching process may be performed to partially expose a top surface of the buffer pattern 305 and an inner surface and a bottom surface of the recess R1. A first spacer layer may be formed on the substrate 10. An insulating layer may be formed to fill the recess R1 and then may be anisotropically etched to leave the lower gapfill insulating pattern 314 in the recess R1. During the anisotropic etching process, the first spacer layer may be etched to form the first sub-spacer 321.

A sacrificial spacer layer may be conformally formed on the substrate 10, and then, an anisotropic etching process may be performed on the sacrificial spacer layer to form a sacrificial spacer SP covering a side surface of the first sub-spacer 321. The sacrificial spacer SP may be formed of or include a material having an etch selectivity with respect to the first sub-spacer 321. The second sub-spacer 325 may be formed to cover a side surface of the sacrificial spacer SP. In an implementation, the top surface of the buffer pattern 305 may be exposed, after the formation of the second sub-spacer 325.

Figure 7A:
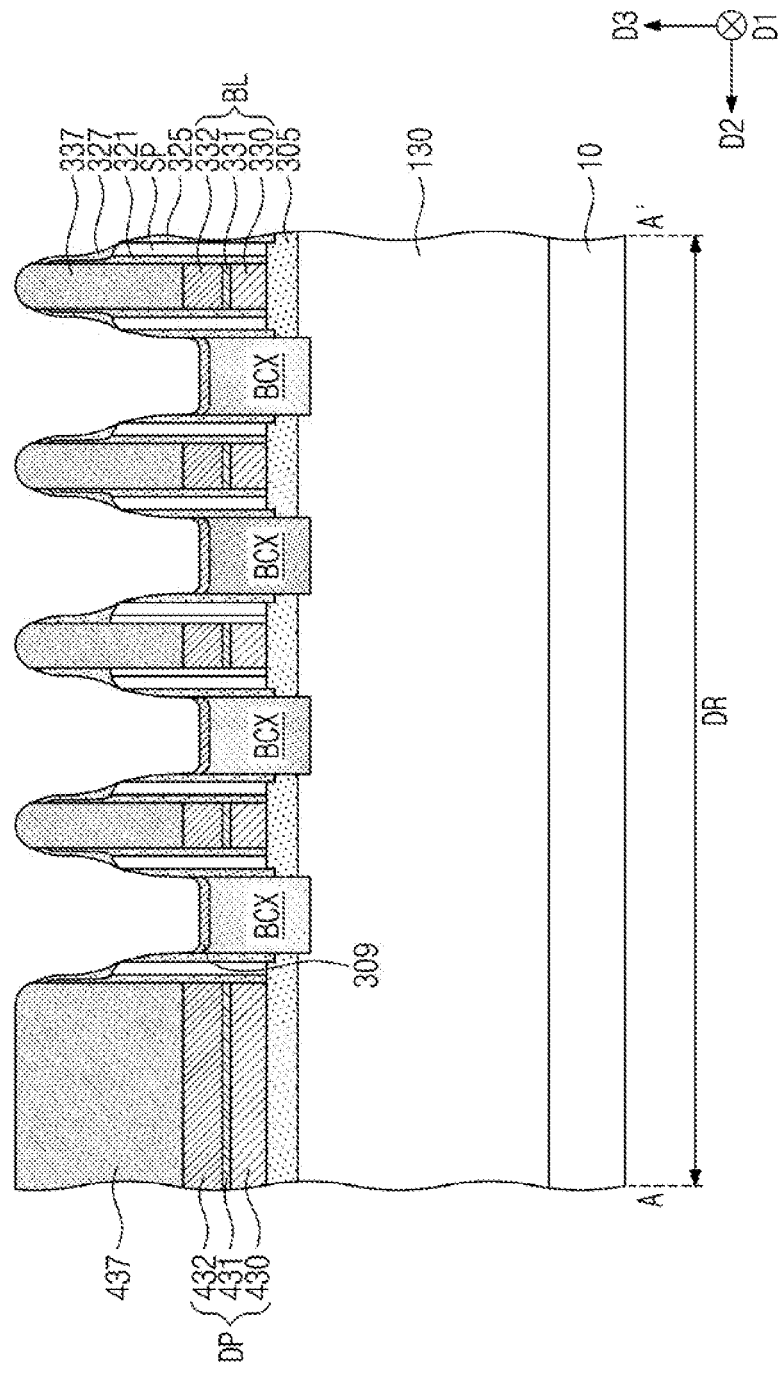
Figure 7B:
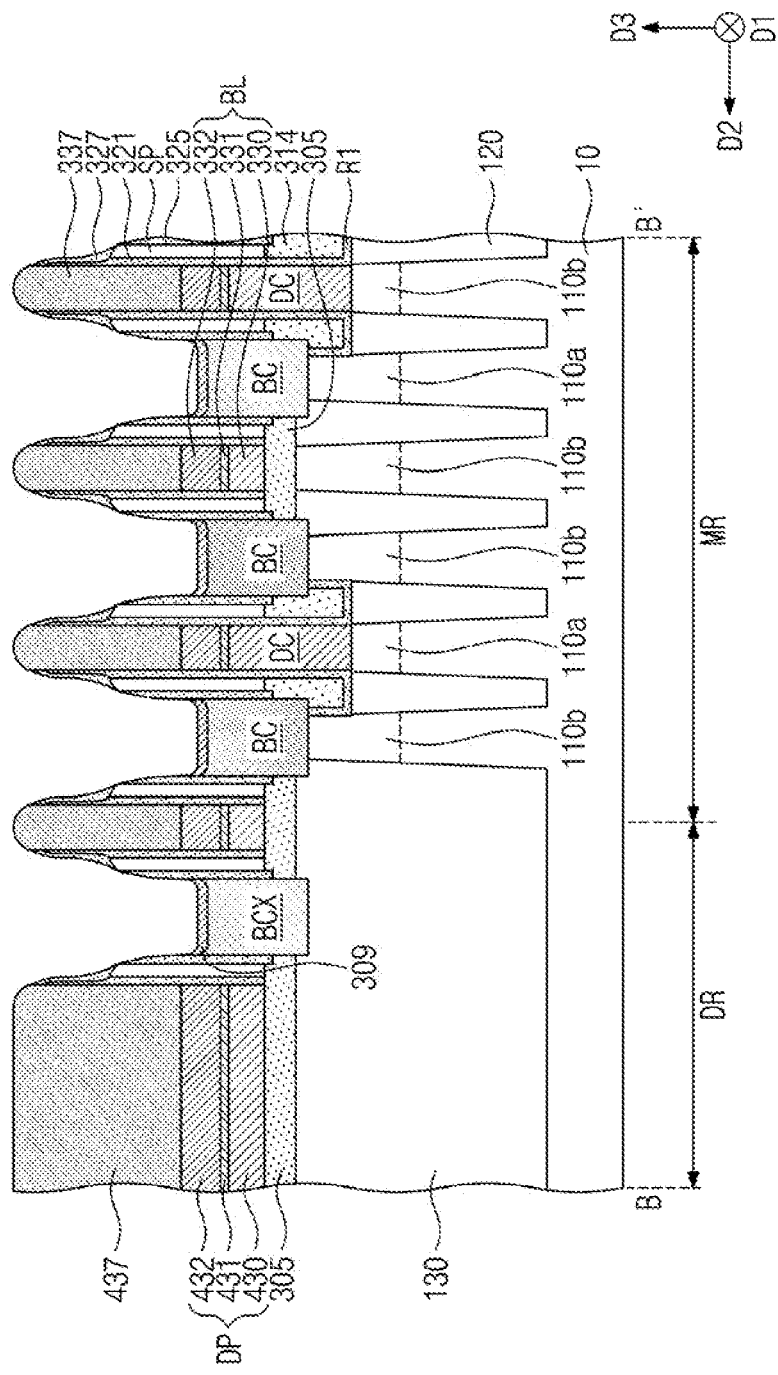

Referring to FIGS. 7A and 7B, a polysilicon layer may be formed on the substrate 10 to fill spaces between the bit lines BL and then may be etched to form a preliminary storage node contact and a preliminary dummy storage node contact and to expose upper portions of the first sub-spacer 321, the sacrificial spacer SP, and the second sub-spacer 325. The upper portion of the first sub-spacer 321 may also be partially etched, when the upper portions of the sacrificial spacer SP and the second sub-spacer 325 are etched, and in this case, a width of the first sub-spacer 321 may be reduced. Thereafter, a third spacer layer may be conformally formed on the substrate 10 and may be anisotropically etched to form a third sub-spacer 327 covering a side surface of the exposed upper portion of the first sub-spacer 321. The third sub-spacer 327 may cover the exposed upper portion of the sacrificial spacer SP. The preliminary storage node contact and the preliminary dummy storage node contact may be etched to form the storage node contact BC and the dummy storage node contact BCX, and here, an upper portion of the second sub-spacer 325 may be exposed to the outside. The second ohmic pattern 309 may be formed on each of the storage node contact BC and the dummy storage node contact BCX.

Figure 8A:
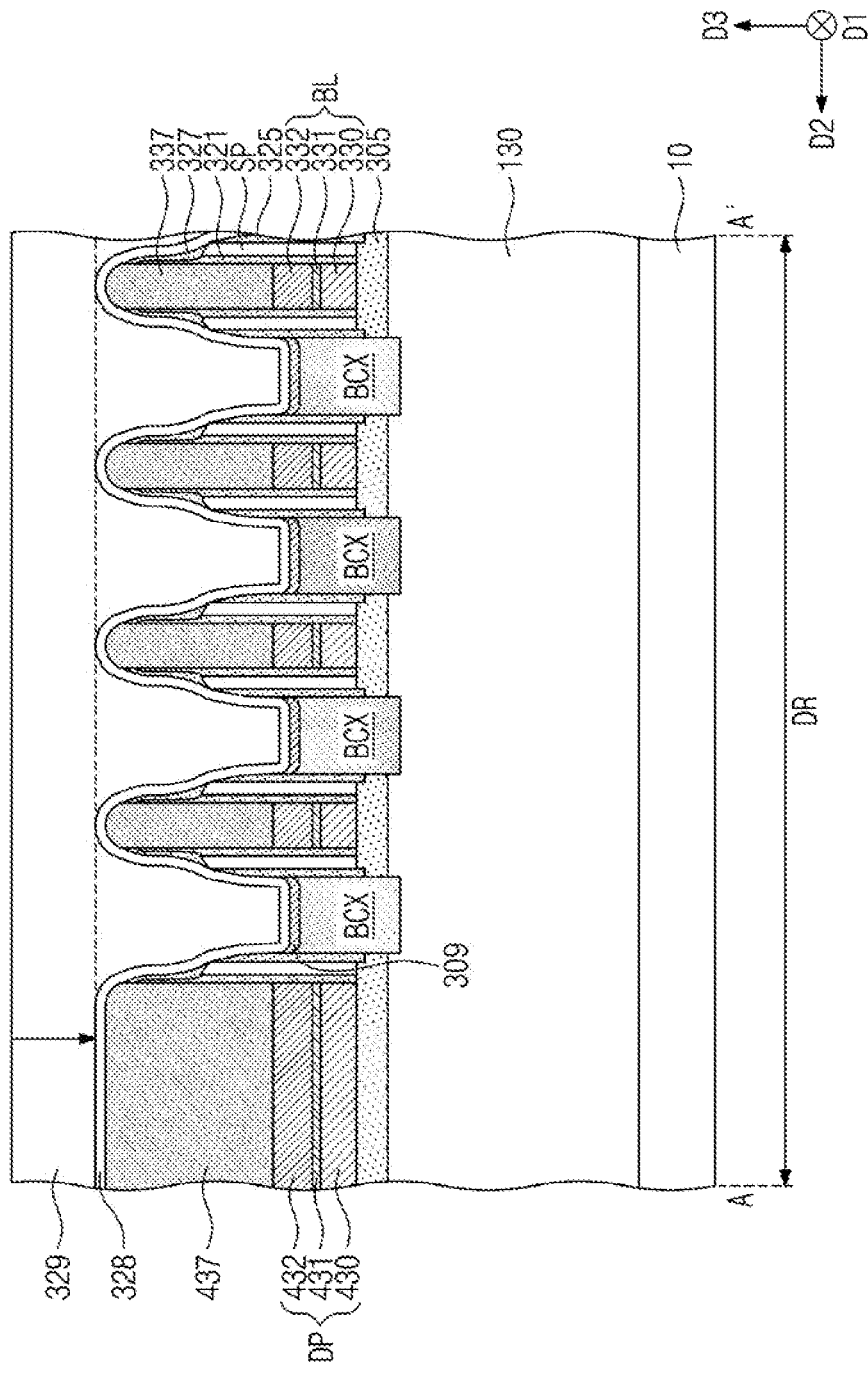
Figure 8B:
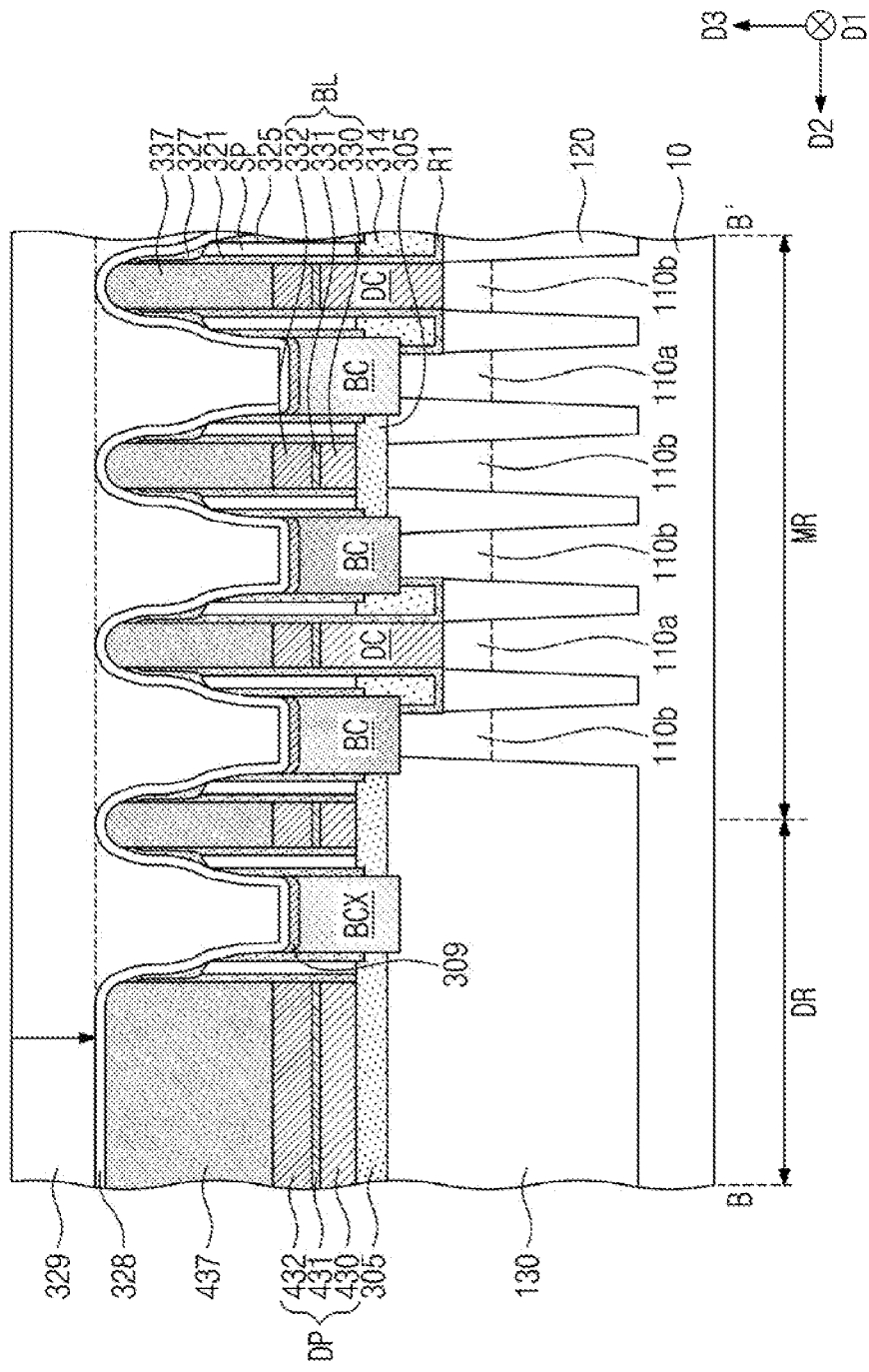

Referring to FIGS. 8A and 8B, a protection layer 328 may be formed on the substrate 10. In an implementation, the protection layer 328 may include a silicon nitride layer (SiN). The protection layer 328 may be formed by a deposition process. The protection layer 328 may be formed to cover the first sub-spacer 321, the sacrificial spacer SP, the second sub-spacer 325, the third sub-spacer 327, the bit line capping pattern 337, the dummy capping pattern 437, the storage node contact BC, and the dummy storage node contact BCX.

An insulating layer 329 may be formed on the protection layer 328. The insulating layer 329 may be deposited to cover the entire region of the substrate 10 and may have a thickness (in the third direction D3) that is larger than heights of the bit line capping pattern 337 and the dummy capping pattern 437. The insulating layer 329 may be formed of or include a material having an etch selectivity with respect to the protection layer 328. In an implementation, the insulating layer 329 may be formed of or include silicon oxide (SiO$_2$). Thereafter, a planarization process may be performed on the insulating layer 329 throughout the substrate 10. As a result of the planarization process, it may be possible to reduce a height difference between the memory cell region MR, the intermediate region DR, and the peripheral region PR, which could otherwise be caused by a difference in pattern density between the memory cell region MR, the intermediate region DR, and the peripheral region PR. The planarization process on insulating layer 329 may be performed until the protection layer 328 is exposed. When the planarization process is finished, portions of the insulating layer 329 may be left or remain between the bit lines BL and between the bit line BL and the dummy pattern DP.

Figure 9A:
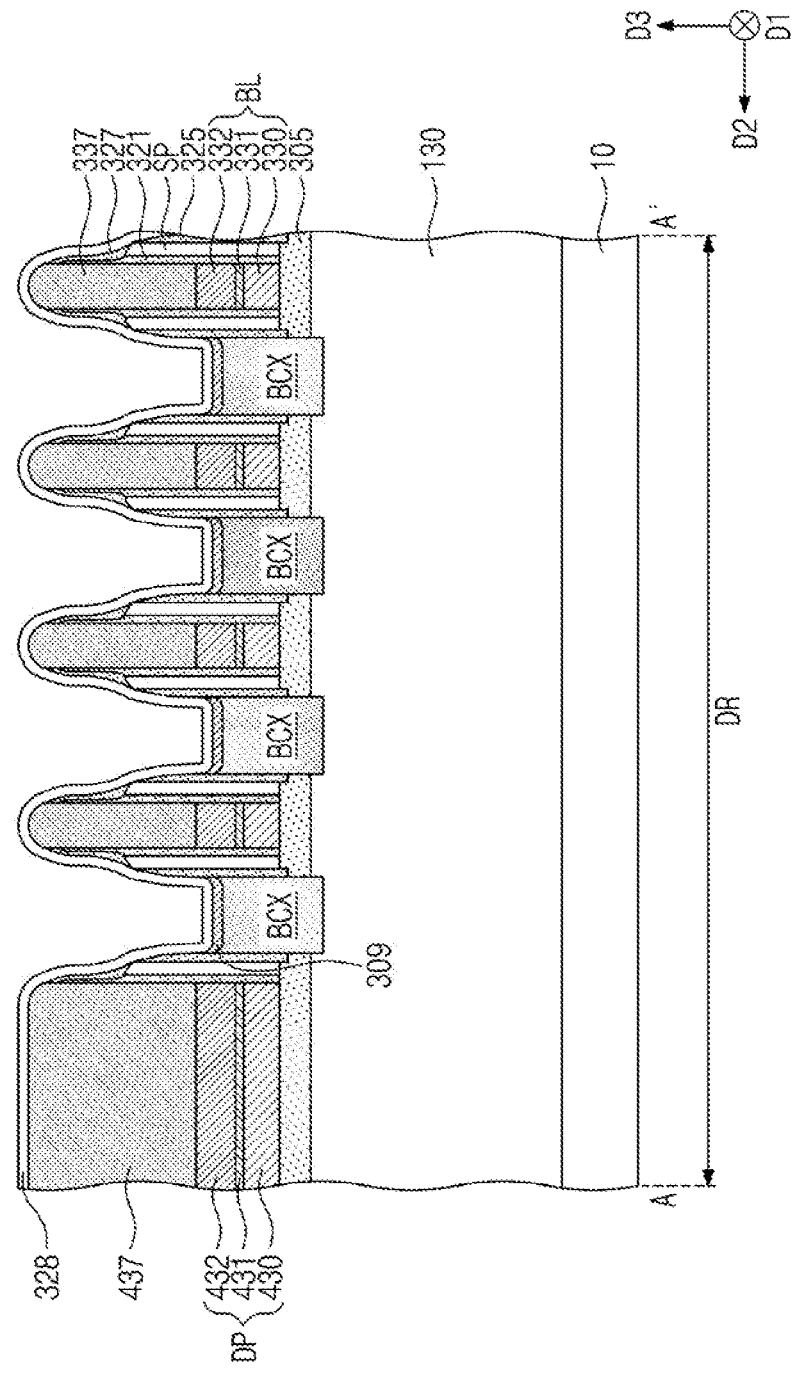
Figure 9B:
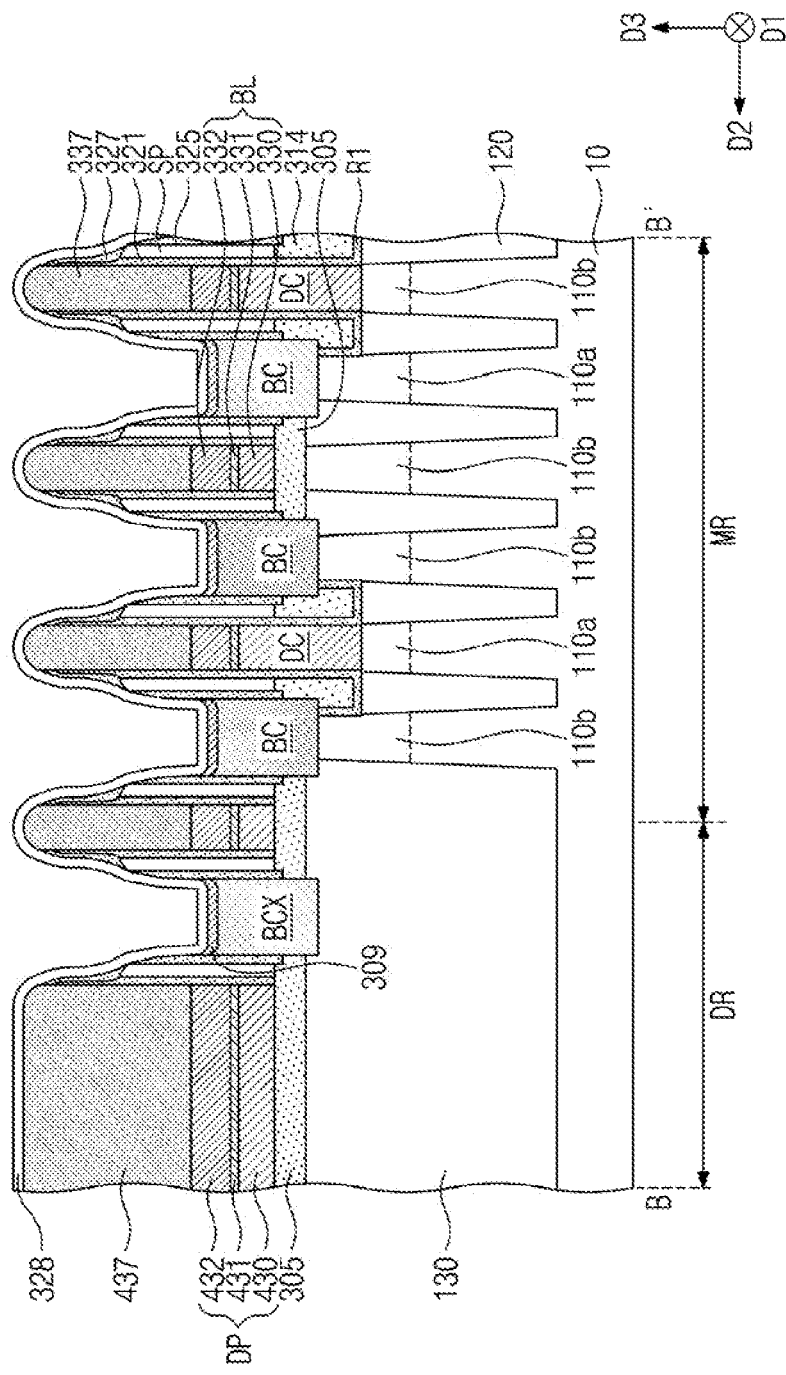

Referring to FIGS. 9A and 9B, the remaining portions of the insulating layer 329 may be removed by a selective etching process. In an implementation, the selective etching process may be a wet etching process. As a result of the removal of the insulating layer 329, the protection layer 328 may be fully exposed. The protection layer 328 may help prevent an etchant, which is used in the wet etching process, from being supplied into the bit line BL.

Figure 10A:
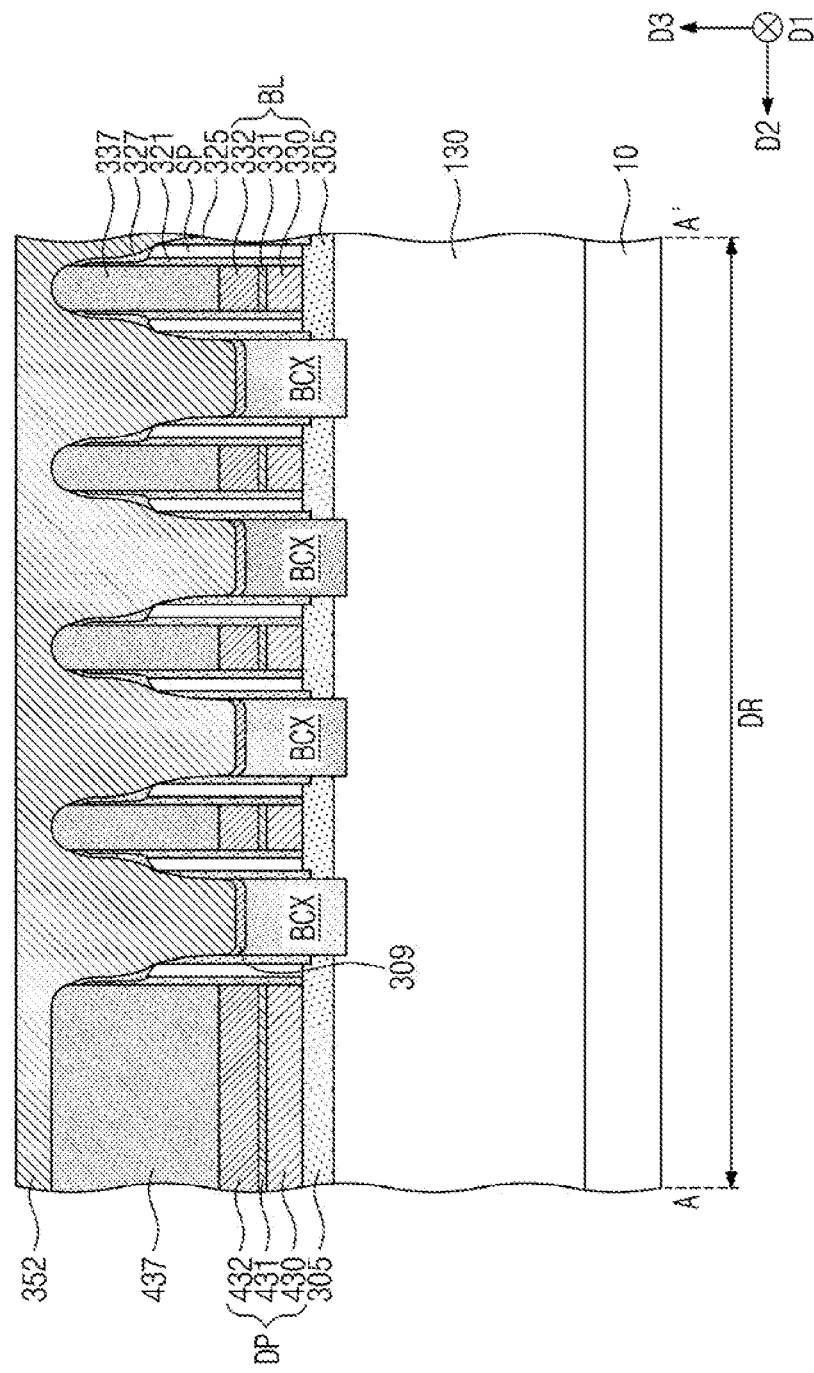
Figure 10B:
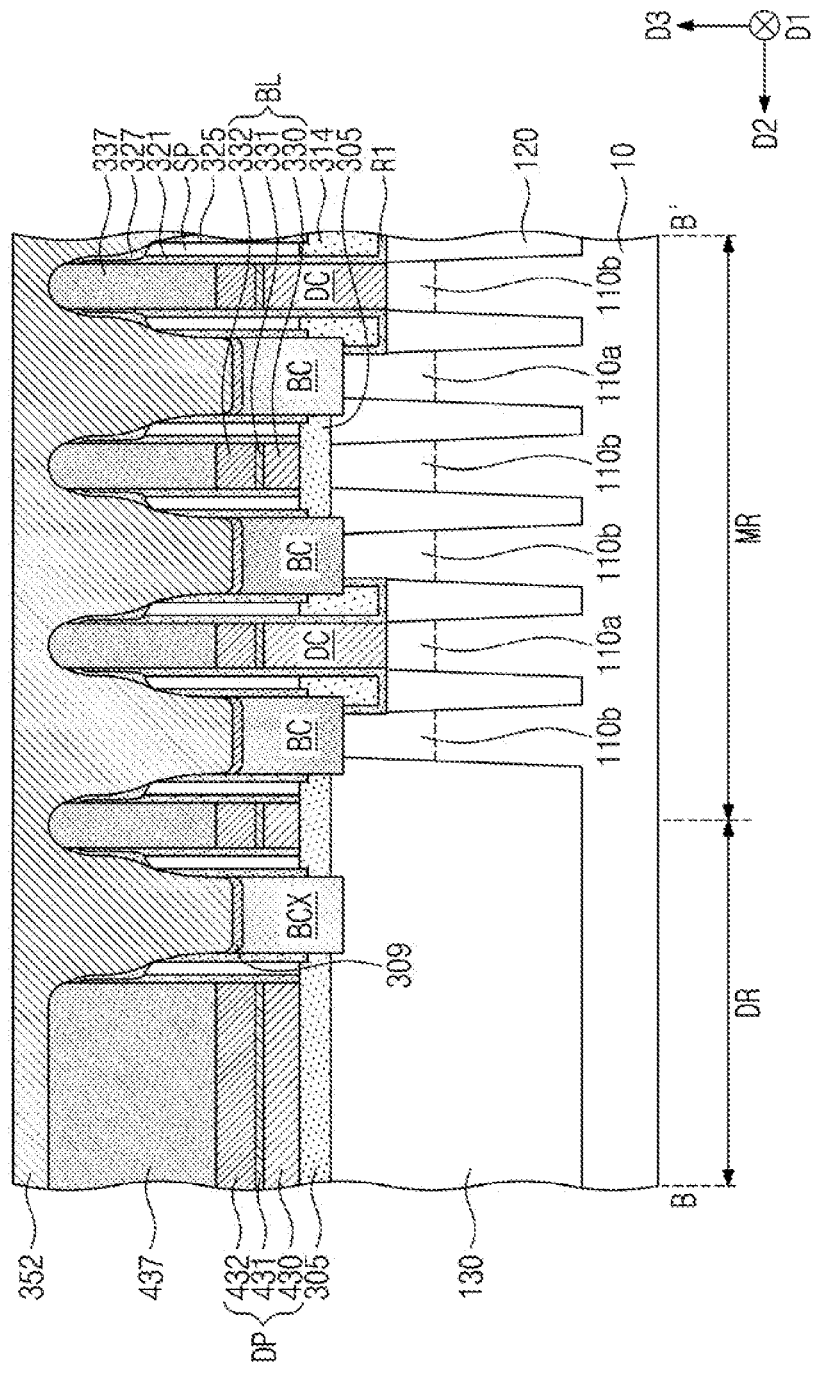

Referring to FIGS. 10A and 10B, the protection layer 328 may be removed. As a result of the removal of the protection layer 328, the second ohmic pattern 309, the bit line capping pattern 337, the dummy capping pattern 437, the first sub-spacer 321, the sacrificial spacer SP, the second sub-spacer 325, and the third sub-spacer 327 may be exposed, e.g., to the outside. A diffusion-prevention layer may be conformally formed on the substrate 10. Thereafter, a metal layer 352 may be formed on the substrate 10. The metal layer 352 may be formed to fill spaces between the bit line capping patterns 337 and between the bit line capping pattern 337 and the dummy capping pattern 437. In an implementation, the metal layer 352 may be a tungsten layer.

Figure 11A:
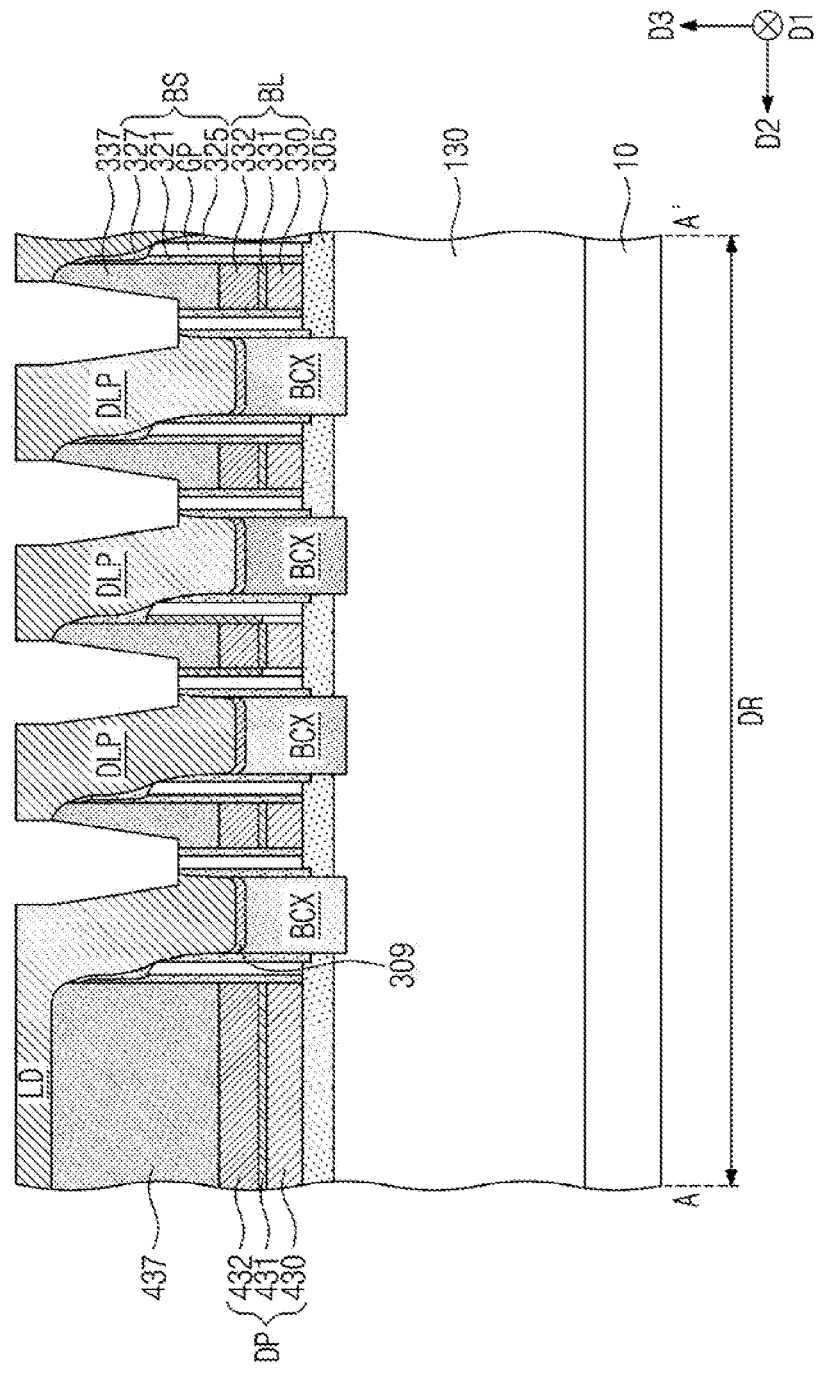
Figure 11B:
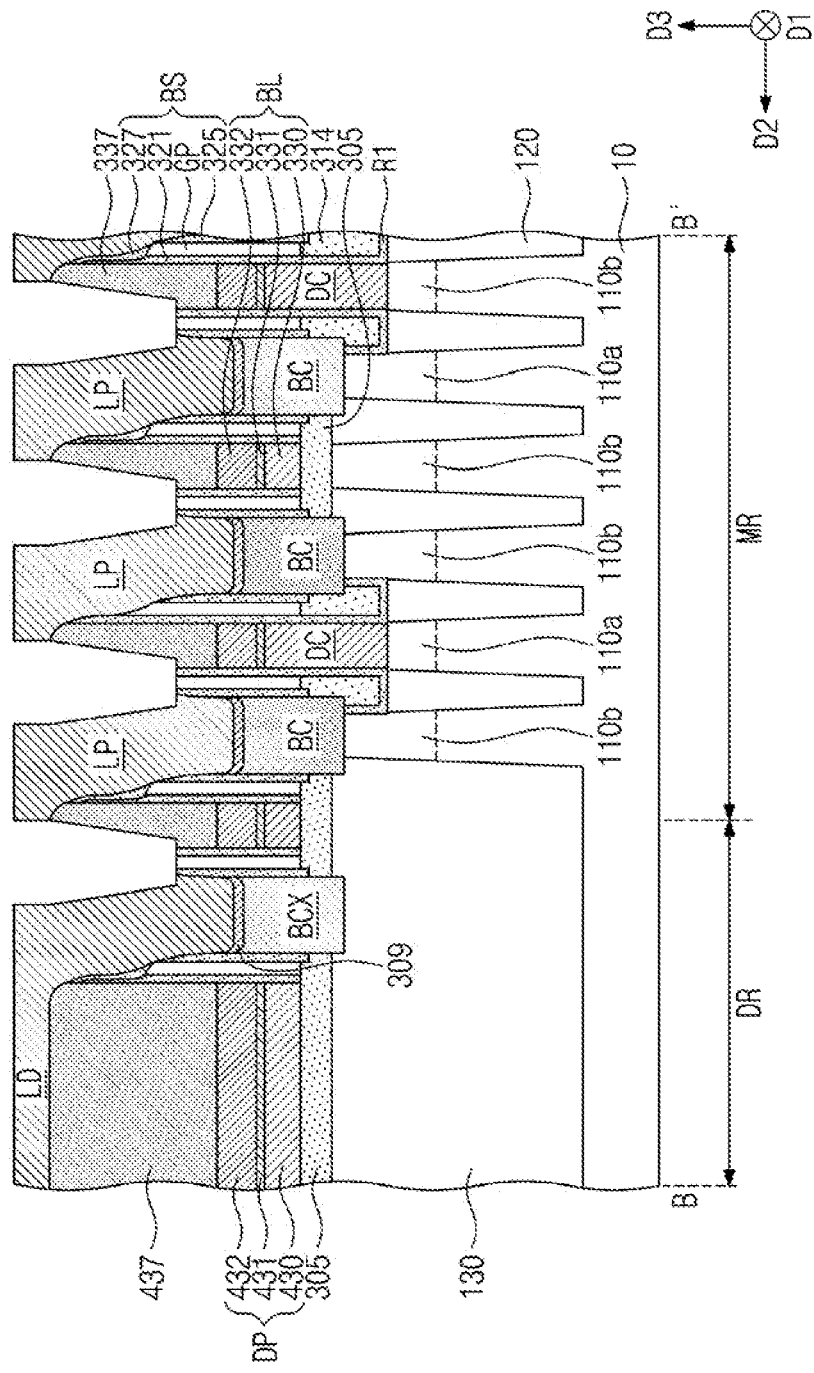

Referring to FIGS. 11A and 11B, the landing pads LP, the dummy landing pads DLP, the dam structure LD, the first metal line pattern MP1, and the second metal line pattern MP2 may be formed by patterning the metal layer 352. The patterning process may include an anisotropic etching process.

The diffusion-prevention patterns, which are separated from each other, may be formed by etching the diffusion-prevention layer, which is exposed by the patterning of the metal layer 352, using an isotropic etching process. Here, the third sub-spacers 327, the bit line capping patterns 337, and the dummy capping pattern 437 may be partially exposed to the outside. The sacrificial spacer SP may be exposed by partially etching the bit line capping patterns 337, the dummy capping pattern 437, and the third sub-spacers 327, e.g., using an anisotropic etching process. The sacrificial spacer SP may be removed to form the air gap GP between the first sub-spacer 321 and the second sub-spacer 325, and as result, the spacer BS including the air gap GP may be formed.

Referring back to FIGS. 4A and 4B, the insulating pattern LS may be formed. In an implementation, an insulating layer may be formed to cover the substrate 10 and an etch-back or CMP process may be performed on the insulating layer to expose the top surface of each of the landing pad LP, the dummy landing pad DLP, the dam structure LD, the first metal line pattern MP1, and the second metal line pattern MP2. Thereafter, the data storage pattern DS may be formed to be in contact with each of the landing pads LP.

Figure 12:
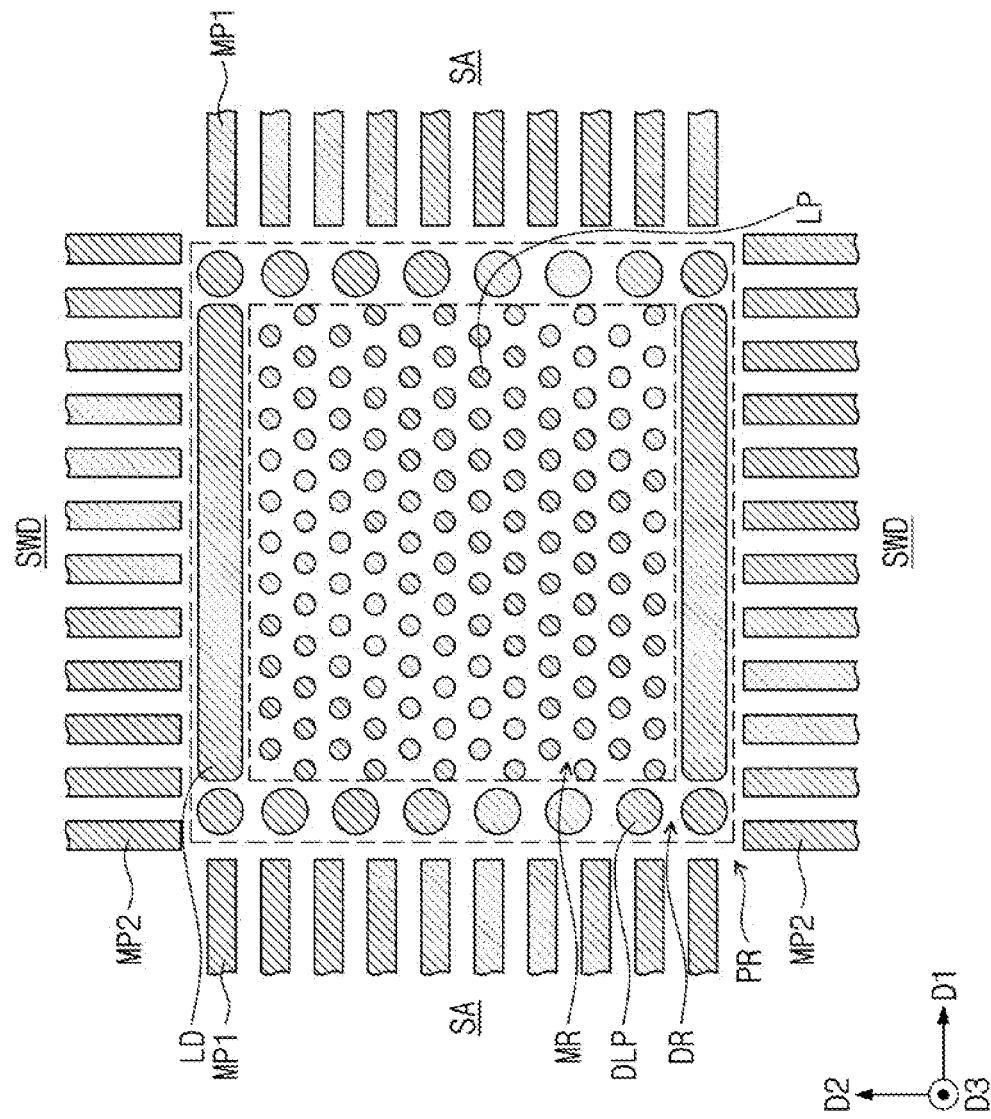
FIG. 12 is a plan view of a semiconductor memory device according to an embodiment.
Figure 13:
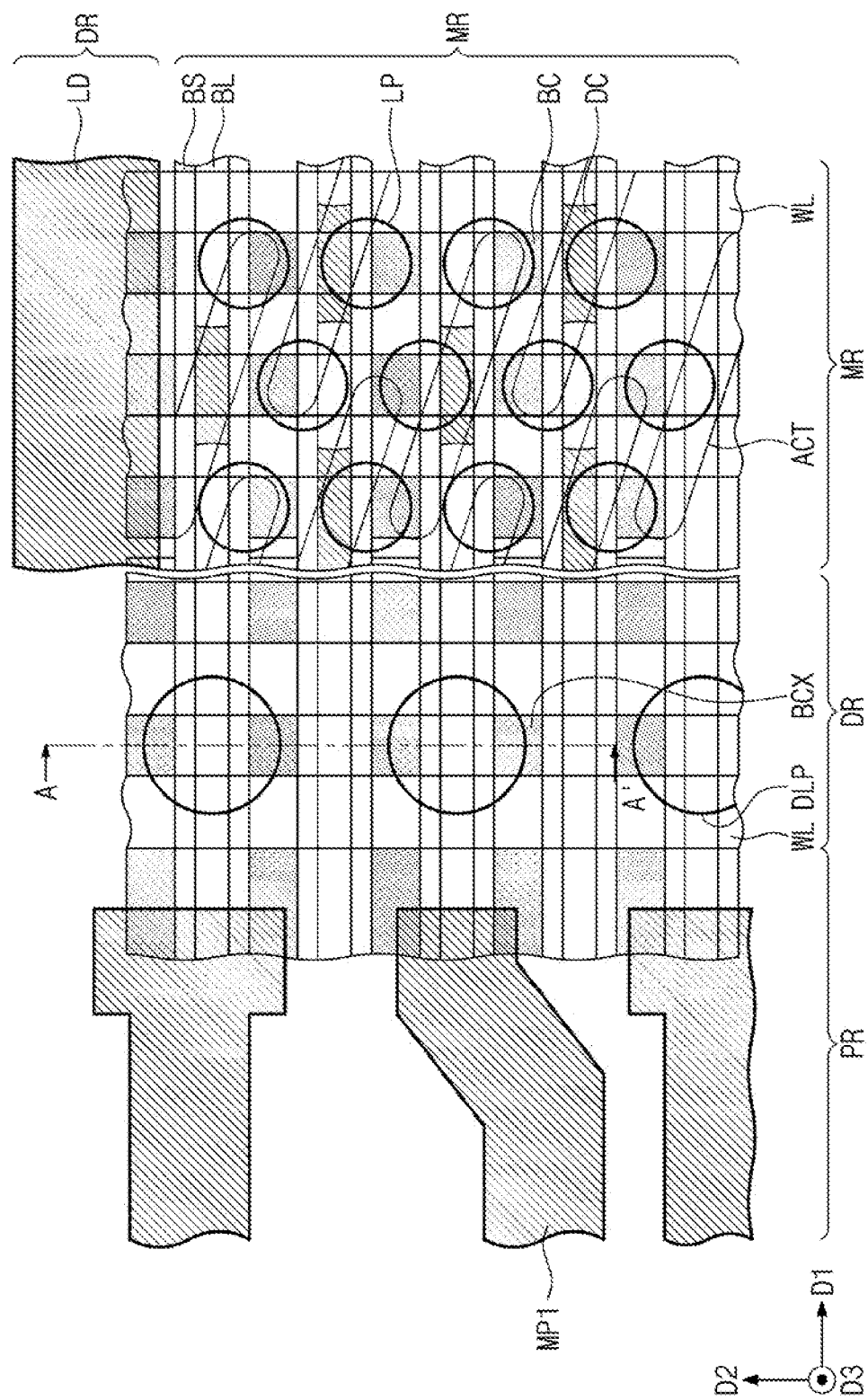
FIG. 13 is an enlarged plan view of a portion of the semiconductor memory device of FIG. 12.
Figure 14:
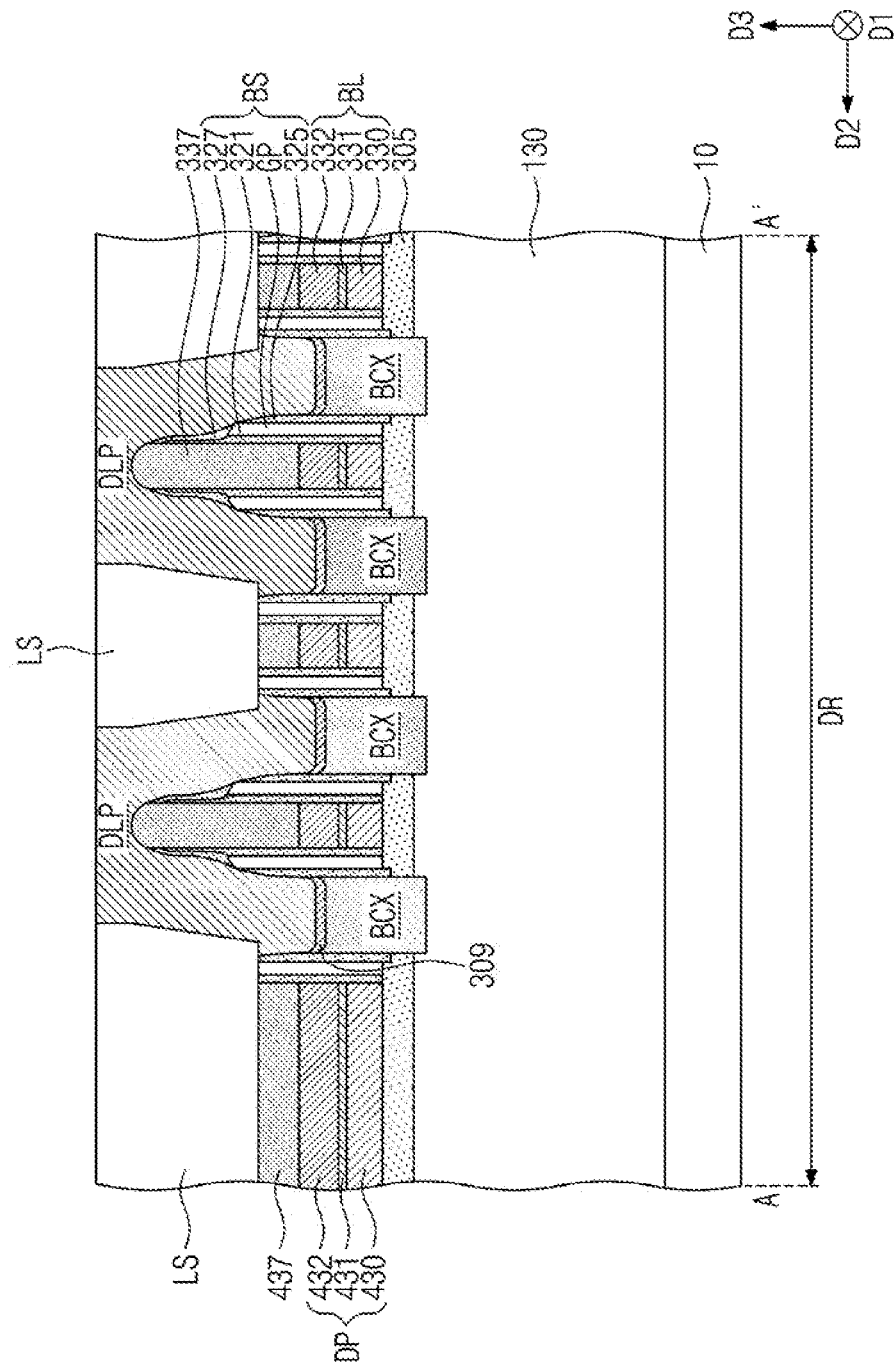
FIG. 14 is a sectional view taken along a line A-A' of FIG. 13.

FIG. 12 is a plan view of a semiconductor memory device according to an embodiment. FIG. 13 is an enlarged plan view of a portion of the semiconductor memory device of FIG. 12. FIG. 14 is a sectional view taken along a line A-A' of FIG. 13. For concise description, an element previously described with reference to FIGS. 2, 3, and 4A to 4C may be identified by the same reference number without repeating an overlapping description thereof.

Referring to FIGS. 12 and 13, the dummy landing pad DLP may have a circular or rounded shape, when viewed in a plan view. A diameter of the dummy landing pad DLP may be larger than a diameter of the landing pad LP. The dummy landing pad DLP may be closer to the first metal line pattern MP1 than it is to the dam structure LD. In an implementation, when viewed in a plan view, one of the dummy landing pads DLP, which is closest or proximate to the second metal line pattern MP2, may be between the first metal line pattern MP1 and the dam structure LD (e.g., in the first direction D1). In an implementation, the dummy landing pad DLP may not be between the dam structure LD and the first metal line pattern MP1. In an implementation, the dummy landing pad DLP, which is closest to the second metal line pattern MP2, may be farther from the second metal line pattern MP2 than it is to the dam structure LD.

Referring to FIGS. 13 and 14, when viewed in a plan view, the dummy landing pads DLP, which are adjacent to each other in the second direction D2, may be spaced apart from each other with at least one of the bit lines BL therebetween. When viewed in a plan view, the insulating pattern LS may be on the bit line BL, which is between the dummy landing pads DLP.

Each of the dummy landing pads DLP may be on a pair of the dummy storage node contacts BCX, which are adjacent to each other in the second direction D2. In an implementation, each of the dummy landing pads DLP may vertically overlap with and be connected to a pair of the dummy storage node contacts BCX, which are adjacent to each other in the second direction D2. The insulating pattern LS may be between the dummy landing pad DLP and the second metal line pattern MP2, when viewed in a sectional view parallel to the second direction D2. Adjacent ones of the dummy landing pads DLP may be separated from each other by the insulating pattern LS. The insulating pattern LS may be on the dummy capping pattern 437.

Figure 15:
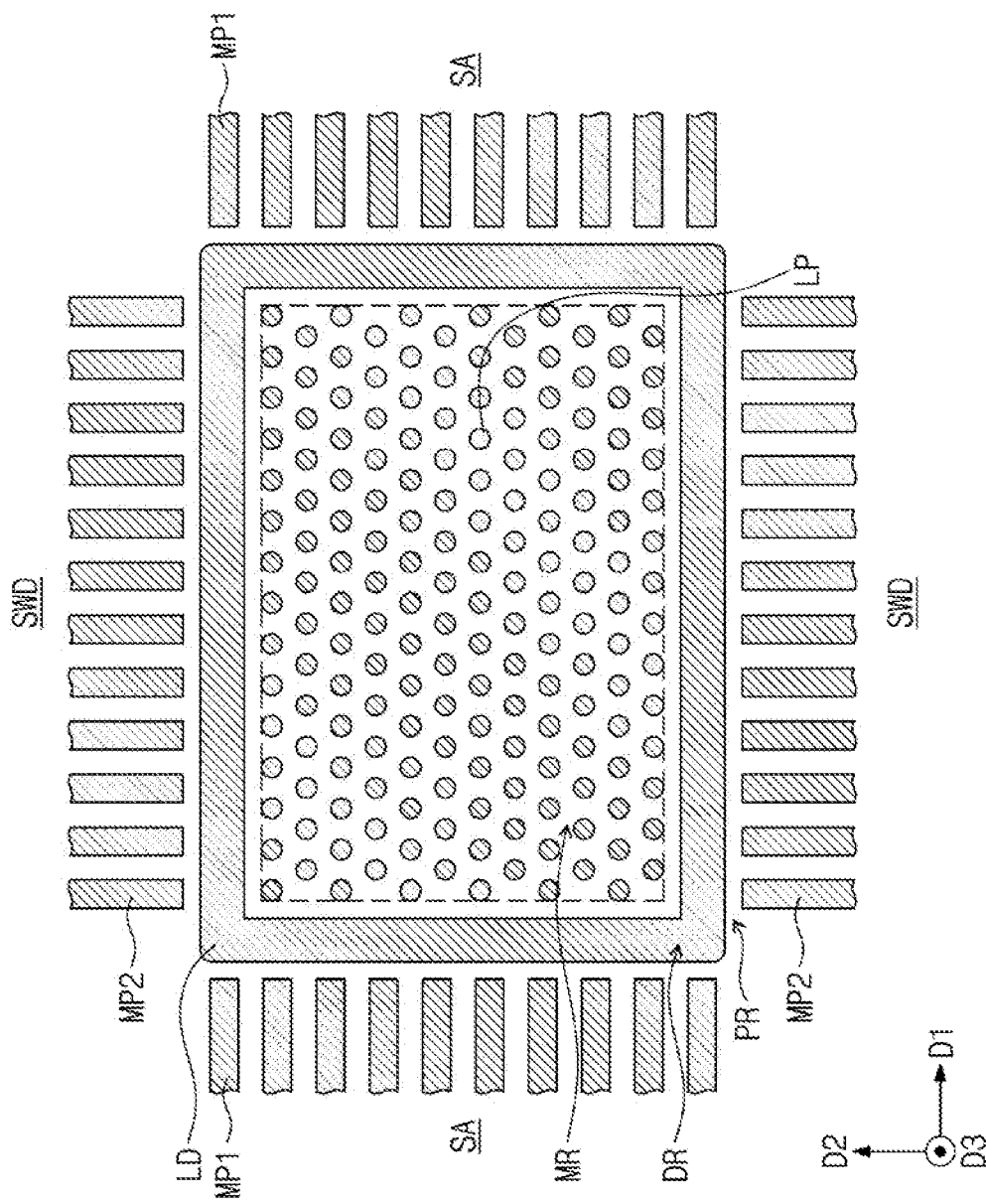
FIG. 15 is a plan view of a semiconductor memory device according to a comparative example
Figure 16:
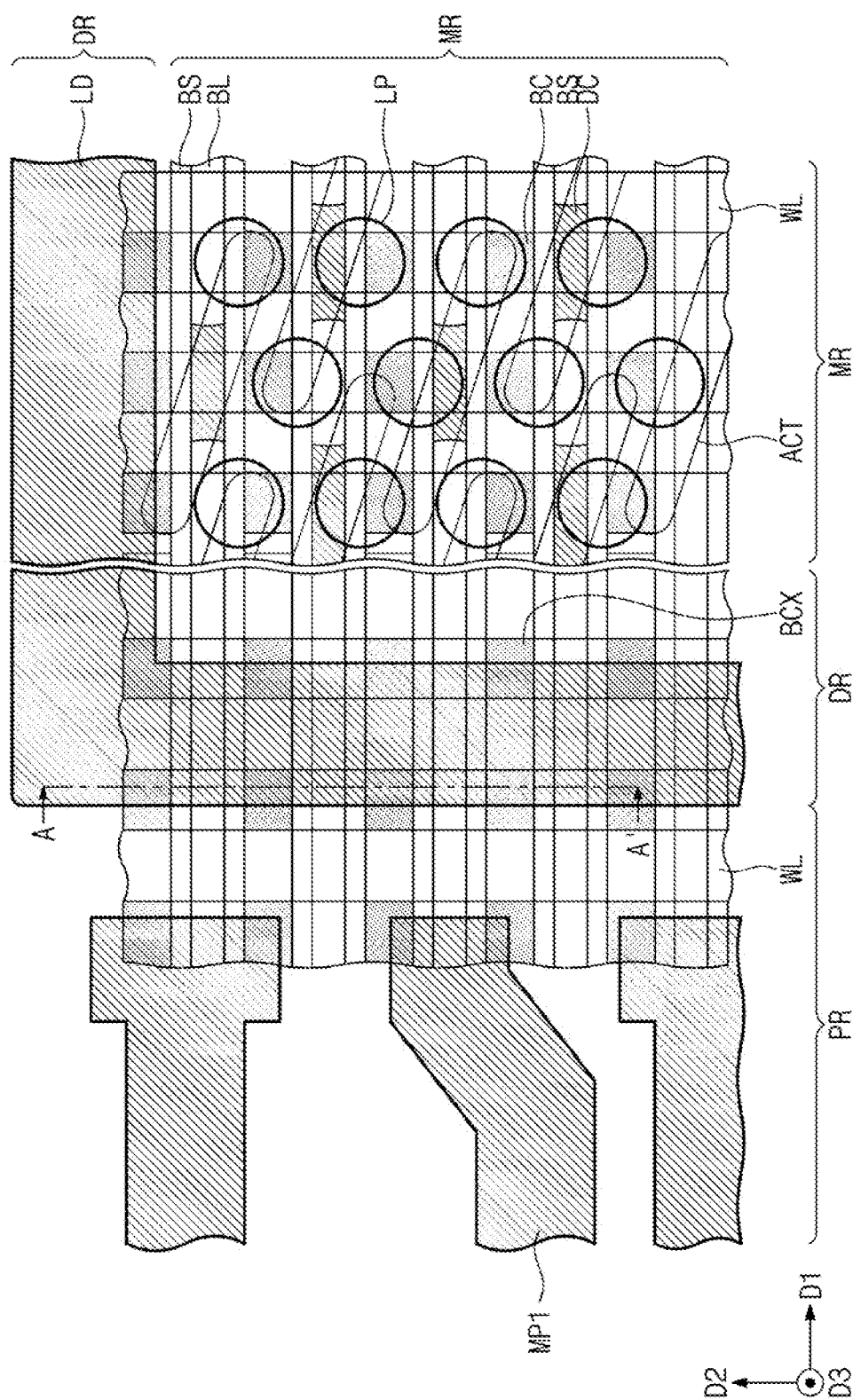
FIG. 16 is an enlarged plan view of a portion of the semiconductor memory device of FIG. 15.
Figure 17:
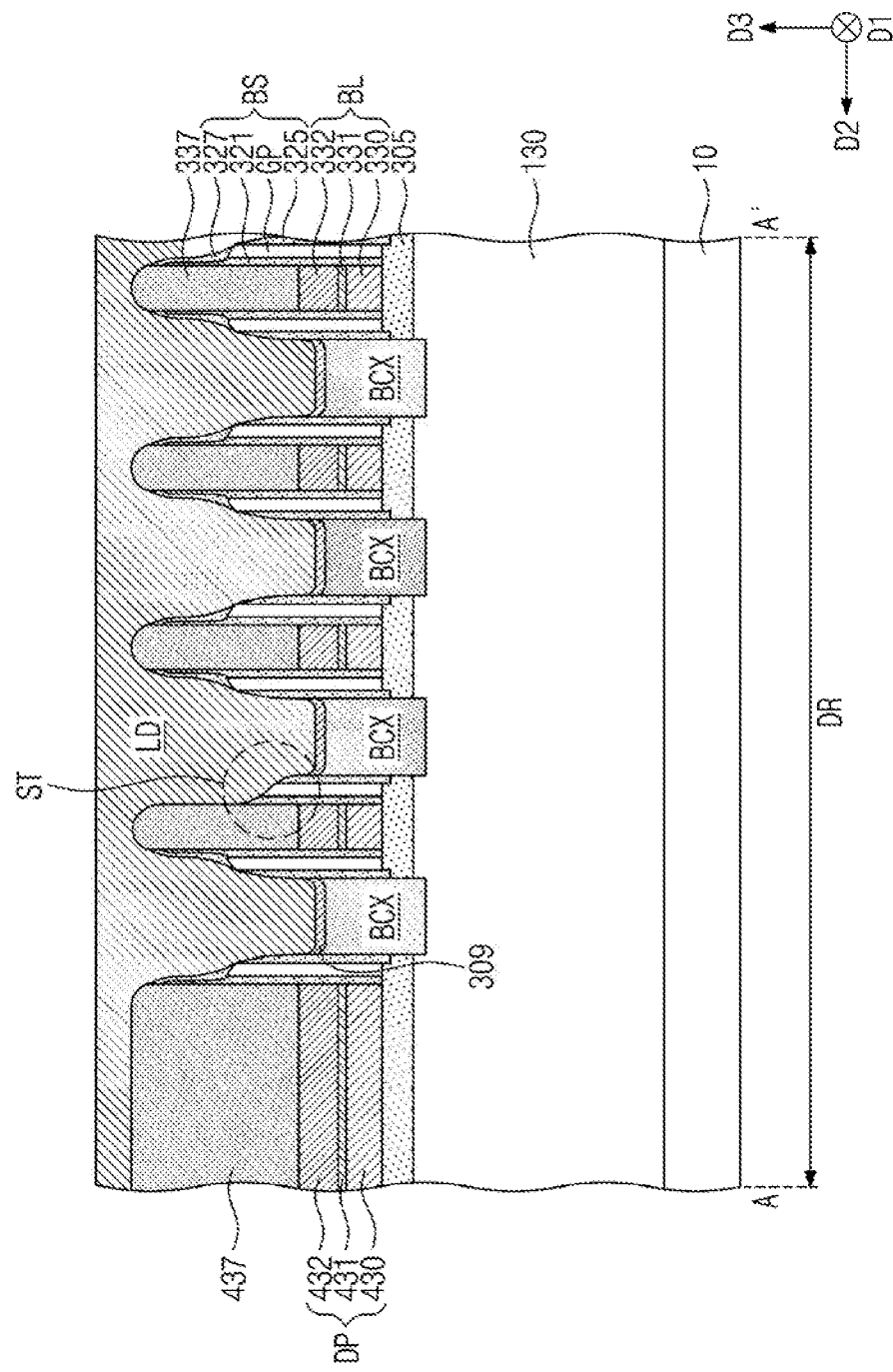
FIG. 17 is a sectional view taken along a line A-A' of FIG. 16.

FIG. 15 is a plan view of a semiconductor memory device according to a comparative example. FIG. 16 is an enlarged plan view of a portion of the semiconductor memory device of FIG. 15. FIG. 17 is a sectional view taken along a line A-A' of FIG. 16. For concise description, an element previously described with reference to FIGS. 2, 3, and 4A to 4C may be identified by the same reference number without repeating an overlapping description thereof.

Referring to FIGS. 15 and 16, the dam structure LD may enclose or surround all corner portions of the memory cell region MR, when viewed in a plan view (e.g., may have a closed loop shape). The dam structure LD may vertically overlap with the bit line BL, unlike those in the embodiments described above. Referring to FIGS. 16 and 17, the dam structure LD may cover the bit lines BL and the dummy storage node contacts BCX. The bit lines BL, which are sequentially arranged in the second direction D2, may vertically overlap with a portion of the dam structure LD extending in the second direction D2.

In the process of removing the left portion of the insulating layer 329 (e.g., see FIGS. 9A and 9B), the protection layer 328 may insufficiently cover the bit line BL or may be over-etched. In this case, the protection layer 328 and the spacers 321, SP, 325, and 327 may be etched by an etchant, and as a result, the bit line BL may be exposed to the outside. In the case where the dam structure LD is formed on such a structure, the exposed portion of the bit line BL may be in contact with a metallic material (e.g., tungsten) formed thereon; e.g., a failure ST (e.g., short circuit) may occur. The dam structure LD may cross a plurality of bit lines BL, and the failure, which could occur at one of the bit lines BL, may affect the other bit lines BL and this may lead to deterioration in reliability of the semiconductor memory device.

By contrast, according to an embodiment, it is possible to realize a highly-reliable semiconductor memory device. In addition, the dummy landing pad DLP, like the dam structure LD, may help reduce a process difficulty, which could otherwise be caused by a difference in pattern density between the memory cell region MR and the peripheral region PR, and may help improve the structural and operational reliability of the semiconductor memory device.

By way of summation and review, an increase of the integration density of a semiconductor device could cause an increase of difficulty or failure rate in a process of fabricating a semiconductor device. As the integration density of the semiconductor device increases, the production yield and operation characteristics of the semiconductor device could be reduced. Accordingly, the production yield and operation reliability of the semiconductor device may be improved.

According to an embodiment, a dam structure may be on an intermediate region between a memory cell region and a peripheral region. The dam structure may extend in a first direction, which is parallel to an extension direction of bit lines, and may not extend in a second direction perpendicular to the first direction. Thus, the dam structure may not be vertically overlapped with the bit lines, in the second direction. Dummy landing pads, which are spaced apart from each other, may be on the intermediate region and may be arranged or spaced apart in the second direction to be vertically overlapped with the bit lines. Even if one of the bit lines were to be damaged by an etching process, the dummy landing pad connected thereto may be separated from other landing pads, and thus, the other bit lines may not be affected by the damaged one of the bit lines. In an implementation, even if a short circuit were to occur between one of the bit lines and the dummy landing pad, the other bit lines may not be affected by the short circuit, because the dummy landing pads are spaced apart from each other. This may make it possible to improve reliability of a semiconductor memory device.

One or more embodiments may provide a semiconductor memory device including a landing pad and a dam structure.

One or more embodiments may provide a highly-reliable semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
   a substrate including a memory cell region, a peripheral region laterally enclosing the memory cell region, and an intermediate region laterally between the memory cell region and the peripheral region;
   a device isolation pattern on the substrate in the memory cell region and defining active portions in the memory cell region;
   a partitioning pattern on the substrate in the intermediate region;
   a plurality of bit lines on the substrate in the memory cell region and the intermediate region and extending in a first direction, the bit lines extending to a boundary between the intermediate region and the peripheral region;
   storage node contacts on the substrate in the memory cell region and each storage node contact filling a lower portion of a space between first respective pairs of the bit lines;
   landing pads on the storage node contacts, respectively;
   dummy storage node contacts on the substrate in the intermediate region, in contact with the partitioning pattern, and each dummy storage node contact filling a lower portion of a space between second respective pairs of the bit lines;
   dummy landing pads on the dummy storage node contacts, respectively; and
   at least one dam structure on the substrate in the intermediate region and extending in the first direction, the at least one dam structure having a bar shape when viewed in a plan view,
   wherein the dummy landing pads are spaced apart from one another and from an edge portion of the at least one dam structure in a second direction perpendicular to the first direction and include metal.

2. The semiconductor memory device as claimed in claim 1, wherein the at least one dam structure includes a pair of dam structures, which are spaced apart from each other in the second direction with the memory cell region therebetween.

3. The semiconductor memory device as claimed in claim 1, wherein a top surface of the at least one dam structure is at a same level as top surfaces of the dummy landing pads and top surfaces of the landing pads.

4. The semiconductor memory device as claimed in claim 1, wherein:
   each of the dummy landing pads and each of the landing pads has a circular shape, when viewed in a plan view,
   the dummy landing pads each have a first diameter, and
   the landing pads each have a second diameter that is substantially equal to the first diameter.

5. The semiconductor memory device as claimed in claim 1, wherein:
   each of the dummy landing pads and each of the landing pads has a circular shape, when viewed in a plan view,
   the dummy landing pads each have a first diameter, and
   the landing pads each have a second diameter that is smaller than the first diameter.

6. The semiconductor memory device as claimed in claim 1, wherein the at least one dam structure is vertically overlapped with the partitioning pattern.

7. The semiconductor memory device as claimed in claim 1, wherein the at least one dam structure is spaced apart from the bit lines, when viewed in a plan view.

8. The semiconductor memory device as claimed in claim 1, further comprising metal line patterns on the peripheral region, wherein the metal line patterns are electrically connected to the bit lines.

9. The semiconductor memory device as claimed in claim 8, wherein at least one dummy landing pad of the dummy landing pads is closer to the metal line patterns than to the edge portion of the at least one dam structure.

10. A semiconductor memory device, comprising:
a substrate including a memory cell region, a peripheral region laterally enclosing the memory cell region, and an intermediate region laterally between the memory cell region and the peripheral region;
a device isolation pattern on the substrate in the memory cell region and defining active portions in the memory cell region;
a plurality of bit lines on the substrate in the memory cell region and the intermediate region and extending in a first direction, the bit lines extending to a boundary portion between the intermediate region and the peripheral region;
storage node contacts on the substrate in the memory cell region and each storage node contact filling a lower portion of a space between first respective pairs of the bit lines;
landing pads on the storage node contacts, respectively;
dummy storage node contacts on the substrate in the intermediate region and each dummy storage node contact filling a lower portion of a space between second respective pairs of the bit lines;
dummy landing pads on the dummy storage node contacts;
a dam structure on the substrate in the intermediate region and spaced apart from the dummy landing pads in a second direction perpendicular to the first direction; and
first metal line patterns on the substrate in the peripheral region, connected to the bit lines, and extending in the first direction,
wherein the dummy landing pads include metal and are closer to the first metal line patterns than to the dam structure, when viewed in a plan view.

11. The semiconductor memory device as claimed in claim 10, further comprising:
a plurality of word lines on the substrate in the memory cell region and the intermediate region and extending in the second direction, the plurality of word lines extending to the boundary portion between the intermediate region and the peripheral region and being at a level lower than the bit lines; and
second metal line patterns on the substrate in the peripheral region, connected to the word lines, and extending in the second direction,
wherein the dam structure is closer to the second metal line patterns than to the dummy landing pads, when viewed in a plan view.

12. The semiconductor memory device as claimed in claim 11, wherein the dam structure has a bar shape and is between the second metal line patterns and the dummy landing pads, when viewed in a plan view.

13. The semiconductor memory device as claimed in claim 11, wherein one of the dummy landing pads, which is closest to the second metal line patterns, is between the first metal line patterns and the dam structure.

14. The semiconductor memory device as claimed in claim 11, wherein the dam structure is not between one of the dummy landing pads, which is closest to the second metal line patterns, and the second metal line patterns.

15. The semiconductor memory device as claimed in claim 10, wherein the dam structure, the dummy landing pads, and the landing pads each includes tungsten (W).

16. The semiconductor memory device as claimed in claim 10, wherein one of the dummy landing pads is on the dummy storage node contacts, which are adjacent thereto in the second direction, and is vertically overlapped with the dummy storage node contacts.

17. A semiconductor memory device, comprising:
a substrate including a memory cell region, a peripheral region laterally enclosing the memory cell region, and an intermediate region laterally between the memory cell region and the peripheral region;
a device isolation pattern on the substrate in the memory cell region and defining active portions in the memory cell region;
a partitioning pattern on the substrate in the intermediate region;
a plurality of bit lines on the substrate in the memory cell region and the intermediate region and extending in a first direction, the plurality of bit lines extending to a boundary portion between the intermediate region and the peripheral region;
dummy storage node contacts on the substrate in the intermediate region and each dummy storage node contact filling a lower portion of a space between respective pairs of the bit lines;
dummy landing pads on the dummy storage node contacts, respectively; and
a pair of dam structures on the substrate in the intermediate region and extending in the first direction,
wherein:
each dam structure of the pair of dam structures has a bar shape, when viewed in a plan view,
the dummy landing pads are spaced apart from an edge portion of the pair of dam structures and apart from one another in a second direction perpendicular to the first direction,
the dam structures of the pair of dam structures are spaced apart from each other with the dummy landing pads and the bit lines therebetween, when viewed in a plan view, and
the dummy landing pads and the pair of dam structures vertically overlap the partitioning pattern on the substrate in the intermediate region and include metal.

18. The semiconductor memory device as claimed in claim 17, wherein the device isolation pattern and the partitioning pattern are each formed of the same insulating material.

19. The semiconductor memory device as claimed in claim 17, further comprising metal line patterns on the substrate in the peripheral region, connected to the bit lines, and extending in the first direction,
wherein the dummy landing pads are closer to the metal line patterns than to the pair of dam structures, when viewed in a plan view.

20. The semiconductor memory device as claimed in claim 17, wherein:
each of the dummy landing pads and each of the landing pads have a circular shape, when viewed in a plan view,
the dummy landing pads each have a first diameter, and
the landing pads each have a second diameter that is equal to or smaller than the first diameter.

* * * * *